US012748520B2

(12) United States Patent
Nam et al.

(10) Patent No.: US 12,748,520 B2
(45) Date of Patent: Sep. 29, 2026

(54) DISPLAY DEVICE AND ELECTRONIC DEVICE HAVING THE SAME

(71) Applicant: Samsung Display Co., Ltd., Yongin-si (KR)

(72) Inventors: Youngwoo Nam, Yongin-si (KR); Deokjung Kim, Yongin-si (KR); Kyunghoe Lee, Yongin-si (KR); Hwan-Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/283,936

(22) Filed: Jul. 29, 2025

(65) Prior Publication Data

US 2026/0037094 A1 Feb. 5, 2026

(30) Foreign Application Priority Data

Jul. 30, 2024 (KR) ........................ 10-2024-0101132

(51) Int. Cl.

*G06F 3/044* (2006.01)
*H10K 59/13* (2023.01)
*H10K 59/40* (2023.01)

(52) U.S. Cl.

CPC ........... *G06F 3/0446* (2019.05); *H10K 59/13* (2023.02); *H10K 59/40* (2023.02); *G06F 2203/04106* (2013.01); *G06F 2203/04111* (2013.01)

(58) Field of Classification Search

CPC ......... G06F 3/0446; G06F 2203/04106; G06F 2203/04111; H10K 59/40

See application file for complete search history.

(56) References Cited

U.S. PATENT DOCUMENTS

| | | | |
|---|---|---|---|
| 9,639,220 B2 | 5/2017 | Wang | |
| 10,146,336 B2 | 12/2018 | Lee et al. | |
| 11,886,671 B2 * | 1/2024 | Kim | G06F 3/0443 |
| 12,105,924 B2 | 10/2024 | Kim et al. | |
| 2021/0193754 A1 | 6/2021 | Han et al. | |
| 2022/0149135 A1 * | 5/2022 | Choi | H10K 59/352 |
| 2023/0105728 A1 | 4/2023 | Park et al. | |
| 2024/0074279 A1 | 2/2024 | Lu et al. | |
| 2024/0074280 A1 | 2/2024 | Bok et al. | |

FOREIGN PATENT DOCUMENTS

| | | |
|---|---|---|
| EP | 4 134 796 A1 | 2/2023 |
| EP | 4 394 566 A1 | 7/2024 |
| KR | 10-2023-0041449 A | 3/2023 |
| KR | 10-2023-0091228 A | 6/2023 |
| KR | 10-2024-0031502 A | 3/2024 |

* cited by examiner

*Primary Examiner* — Kwang-Su Yang

(74) *Attorney, Agent, or Firm* — Womble Bond Dickinson (US) LLP

(57) ABSTRACT

An electronic device includes a display panel and an input sensor. The input sensor includes a plurality of first line components and a plurality of second line components. The first line components include (1-1)-th line components in a first region of the input sensor and (1-2)-th line components in a second region of the input sensor, and the second line components include (2-1)-th line components in the first region and (2-2)-th line components in the second region. The (2-1)-th line component has a smaller line width than the (2-2)-th line component.

20 Claims, 14 Drawing Sheets

DISPLAY DEVICE AND ELECTRONIC DEVICE HAVING THE SAME

CROSS-REFERENCE TO RELATED APPLICATION

This application claims priority to and the benefit of Korean Patent Application No. 10-2024-0101132, filed on Jul. 30, 2024, in the Korean Intellectual Property Office, the entire disclosure of which is incorporated by reference herein.

BACKGROUND

The present disclosure herein relates to a display device including an input sensor and an electronic device having the same.

Multimedia electronic devices such as televisions, mobile phones, tablet computers, laptops, navigation devices, and game consoles include a display device for displaying an image. In addition to typical input methods using a button, a keyboard, a mouse, etc., the electronic devices may include an input sensor (or, an input sensor) capable of providing a touch-based input method which enables a user to input information or a command easily, intuitively, and conveniently. The input sensor may sense a user's touch or pressure. Meanwhile, a demand for the use of a pen for a precise touch input for a user who is familiar with information input using a writing instrument or for a specific application program (for example, an application program for sketching or drawing) is increasing.

SUMMARY

The present disclosure provides a display device for sensing inputs of different types of input devices.

The present disclosure also provides an electronic device in which sensitivity of a photo sensor is improved.

One or more embodiments of the present disclosure provides a display device including a display panel and an input sensor including a sensing region including a first region and a second region having a larger area than the first region and a peripheral region located at an outer side of the sensing region. The input sensor includes a first conductive layer including a plurality of first line components, an insulating layer on the first conductive layer, and a second conductive layer on the insulating layer and including a plurality of second line components. The first line components include (1-1)-th line components in the first region and (1-2)-th line components in the second region, and the second line components include (2-1)-th line components in the first region and (2-2)-th line components in the second region. At least some of the (1-1)-th line components overlap a corresponding (2-1)-th line component from among the (2-1)-th line components, and the at least some (1-1)-th line components have a same line width as or a smaller line width than the corresponding (2-1)-th line component. At least some of the (1-2)-th line components overlap a corresponding (2-2)-th line component from among the (2-2)-th line components, and the at least some of the (1-2)-th line components have a same line width as or a smaller line width than the corresponding (2-2)-th line component. The corresponding (2-1)-th line component has a smaller line width than the corresponding (2-2)-th line component.

In one or more embodiments, the (1-1)-th line components and the (1-2)-th line components may have substantially the same line width.

In one or more embodiments, the plurality of first line components may define a first electrode including division electrodes arranged along a first direction and extending in a second direction crossing the first direction, first patterns between the division electrodes in the first direction and arranged along the second direction, and first bridge patterns between the first patterns in the first direction and arranged along the second direction. The first electrode, the second patterns, and the first bridge patterns may be spaced in a plan view.

In one or more embodiments, the plurality of second line components may define a second electrode extending in the first direction and having a plurality of openings defined therein, second patterns in a corresponding opening from among the plurality of openings and electrically connected in the second direction by the first bridge patterns, and second bridge patterns electrically connecting the first patterns in the first direction. The second electrode, the second patterns, and the second bridge patterns may be spaced in a plan view.

In one or more embodiments, the plurality of openings may include first openings and second openings. The first openings and the second openings may be alternately arranged along the first direction. The first openings may overlap the second patterns, and the second openings may not overlap the second patterns.

In one or more embodiments, the second openings may overlap the first patterns.

In one or more embodiments, the input sensor may further include a trace line in the peripheral region and connected to a corresponding component one selected from among the first electrode, the second electrode, the first patterns, and the second patterns.

In one or more embodiments, the first electrode is configured to induced a magnetic field in response to a current flowing therethrough.

In one or more embodiments, the display panel may include a plurality of light-emitting regions and a non-light-emitting region between the plurality of light-emitting regions, and the plurality of first line components and the plurality of second line components may be in the non-light-emitting region and may define mesh opening regions corresponding to the plurality of light-emitting regions.

In one or more embodiments, an electronic device includes a display device including a display panel and an input sensor including a sensing region including a first region and a second region having a larger area than the first region, and a photo sensor located below the display device and overlapping the second region. The input sensor includes a first conductive layer including a plurality of first line components, an insulating layer on the first conductive layer, and a second conductive layer on the insulating layer and including a plurality of second line components. The first line components include (1-1)-th line components in the first region and (1-2)-th line components in the second region, and the second line components include (2-1)-th line components in the first region and (2-2)-th line components in the second region. At least some of the (1-1)-th line components overlap a corresponding (2-1)-th line component from among the (2-1)-th line components, and the at least some of the (1-1)-th line components have a same line width as or a smaller line width than the corresponding (2-1)-th line component. At least some of the (1-2)-th line components overlap a corresponding (2-2)-th line component from among the (2-2)-th line components, and the at least some of the (1-2)-th line components have a same line width as or a smaller line width than the corresponding (2-2)-th line component. The corresponding (2-1)-th line component has a smaller line width than the corresponding (2-2)-th line component.

In one or more embodiments, the electronic device may further include an input device configured to generate a magnetic field of a resonant frequency.

In one or more embodiments, the input device may include a pen including an RLC resonant circuit.

In one or more embodiments, the input device may be charged by a magnetic field induced by current flowing through the second conductive layer.

In one or more embodiments, the (1-1)-th line components and the (1-2)-th line components may have substantially a same line width.

In one or more embodiments, the plurality of first line components may define a first electrode including division electrodes arranged along a first direction and extending in a second direction crossing the first direction, first patterns between the division electrodes in the first direction and arranged along the second direction, and first bridge patterns between the first patterns in the first direction and arranged along the second direction. The first electrode, the second patterns, and the first bridge patterns may be spaced from each other in a plan view.

In one or more embodiments, the plurality of second line components may define a second electrode extending in the first direction and having a plurality of openings defined therein, second patterns in a corresponding opening from among the plurality of openings and electrically connected in the second direction by the first bridge patterns, and second bridge patterns electrically connecting the first patterns in the first direction. The second electrode, the second patterns, and the second bridge patterns may be spaced from each other in a plan view.

In one or more embodiments, the plurality of openings may include first openings and second openings, the first openings and the second openings may be alternately arranged along the first direction, and the first openings may overlap the second patterns, and the second openings may not overlap the second patterns.

In one or more embodiments, the second openings may overlap the first patterns.

In one or more embodiments, some of the plurality of light-emitting regions may overlap the first region, and other ones of the plurality of light-emitting regions may overlap the second region. Arrangement of light-emitting regions disposed in the first region and arrangement of light-emitting regions disposed in the second region may be same as each other.

In one or more embodiments, an electronic device includes a display device including a display panel and an input sensor including a sensing region including a first region and a second region having a larger area than the first region, and a photo sensor located below the display device and overlapping the first region. The input sensor includes a first electrode including division electrodes arranged along a first direction and extending in a second direction crossing the first direction, first patterns between the division electrodes in the first direction and arranged along the second direction, first bridge patterns between the first patterns in the first direction and arranged along the second direction, an insulating layer on the first electrode, the first patterns, and the first bridge patterns, a second electrode on the insulating layer, extending in the first direction, and having a plurality of openings defined therein, second patterns on the insulating layer and in a corresponding opening from among the plurality of openings, and electrically connected in the second direction by the first bridge patterns, and second bridge patterns on the insulating layer and electrically connecting the first patterns in the first direction. The first electrode, the first patterns, and the first bridge patterns include first line components, and the second electrode, the second patterns, and the second bridge patterns include second line components, and the first line components include (1-1)-th line components in the first region and (1-2)-th line components in the second region, and the second line components include (2-1)-th line components in the first region and (2-2)-th line components in the second region. At least some of the (1-1)-th line components overlap a corresponding (2-1)-th line component from among the (2-1)-th line components, and the at least some of the (1-1)-th line components have a same line width as or a smaller line width than the corresponding (2-1)-th line component, at least some of the (1-2)-th line components overlap a corresponding (2-2)-th line component from among the (2-2)-th line components, and the at least some of the (1-2)-th line components have a same line width as or a smaller line width than the corresponding (2-2)-th line component, and the corresponding (2-1)-th line component have a smaller line width than the corresponding (2-2)-th line component.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles and scope of the present disclosure. In the drawings.

DETAILED DESCRIPTION

Figure 1:
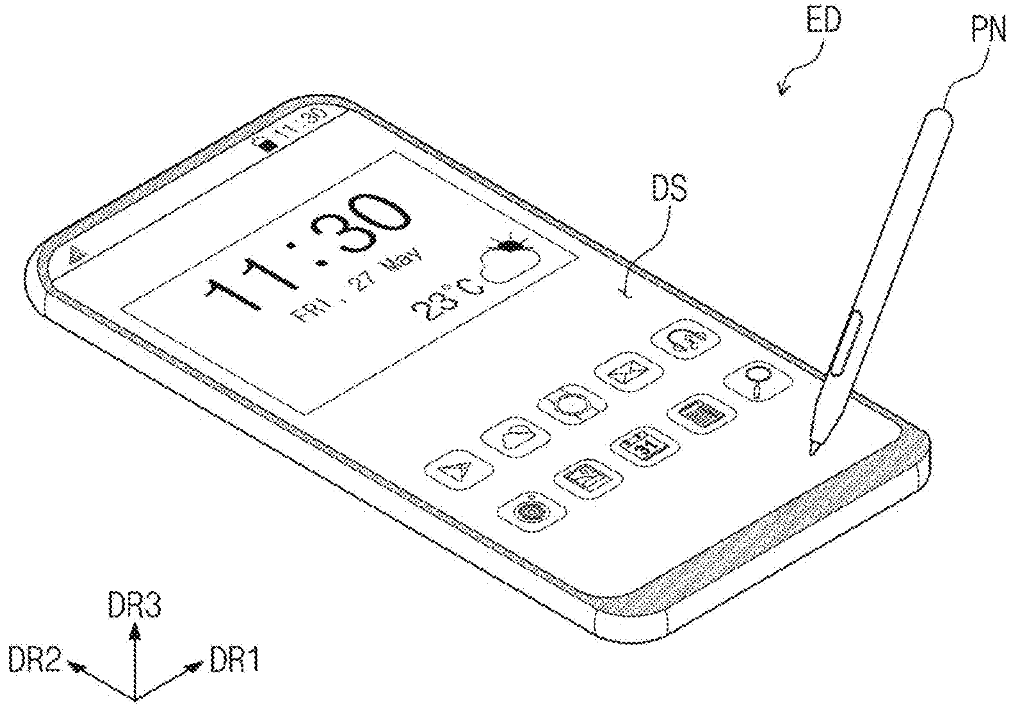
FIG. 1 is a perspective view of an electronic device according to one or more embodiments.

In the present disclosure, it will be understood that when an element or a layer is referred to as being "on", "connected to" or "coupled to" another element or layer, it may be directly disposed on, connected or coupled to the other element or layer, or an intervening element or layer may be disposed therebetween. In contrast, when an element or a layer is referred to as being "directly on," "directly connected to" or "directly coupled to" another element or layer, there are no intervening elements or layers disposed therebetween.

Like reference numerals or symbols refer to like elements. Also, in the drawings, the thicknesses, ratios, and dimensions of the elements are exaggerated for effective description of the technical contents. The term "and/or" includes all of one or more combinations that may be defined by related elements.

Although the terms first, second, etc. may be used herein to describe various elements, regions, and/or layers, these elements, regions, and/or layers should not be limited by these terms. These terms are only used to distinguish one element from another element. For example, a first element may be referred to as a second element without departing from the spirit and scope of the present disclosure. The singular forms include the plural forms as well unless the context clearly indicates otherwise.

In addition, the terms such as "below", "on lower side", "above", and "on upper side" may be used herein to describe the relationships of the elements illustrated in the drawings. These terms have relative concepts and are described on the basis of the directions indicated in the drawings.

It will be understood that the terms such as "include" or "have", when used herein, are intended to specify the presence of stated features, integers, steps, operations, elements, components, or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

For the purposes of the present disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, XZ, YZ, and ZZ, or any variation thereof. Similarly, the expression such as "at least one of A and/or B" may include A, B, or A and B. As used herein, the term "and/or" includes any and all combinations of one or more of the associated listed items. For example, the expression such as "A and/or B" may include A, B, or A and B. Further, the use of "may" when describing embodiments of the present disclosure refers to "one or more embodiments of the present disclosure".

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

Hereinafter, embodiments of the present disclosure will be described with reference to the drawings.

Figure 2:
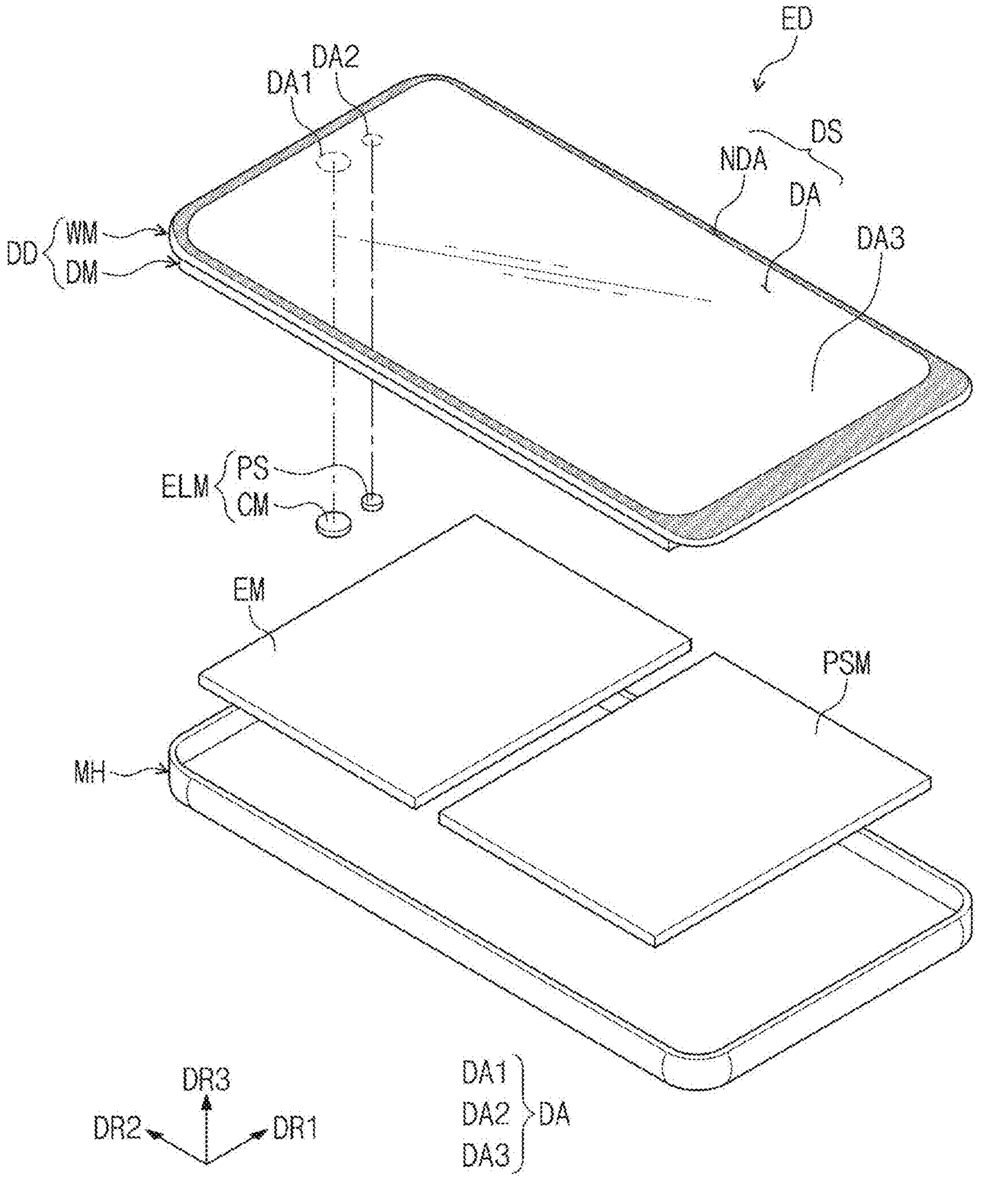
FIG. 2 is an exploded perspective view of an electronic device according to one or more embodiments.
Figure 3:
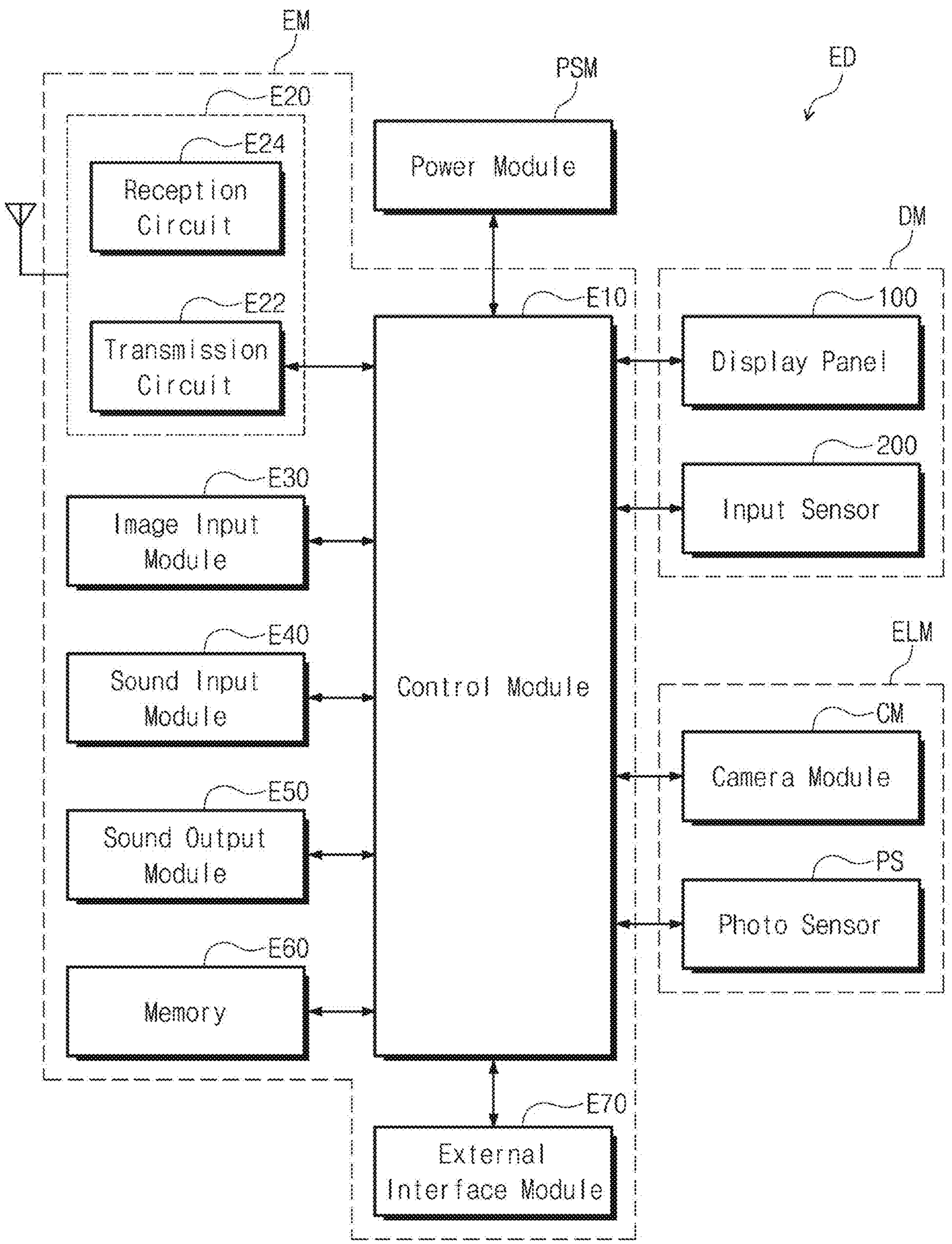
FIG. 3 is a block diagram of an electronic device according to one or more embodiments.

FIG. 1 is a perspective view of an electronic device ED according to one or more embodiments. FIG. 2 is an exploded perspective view of the electronic device ED according to one or more embodiments. FIG. 3 is a block diagram of the electronic device ED according to one or more embodiments.

In the present embodiment, the electronic device ED may be activated in response to an electrical signal. For example, the electronic device ED may display an image and sense inputs applied from the outside. An external input may be a user's input. The external input may include inputs in various forms such as an input from a user's body or an input of an input mean (e.g., an input device).

A display surface DS of the electronic device ED may be defined by a first direction DR1 and a second direction DR2 crossing each other. A thickness direction of the electronic device ED may be a third direction DR3, which is a normal direction of the display surface DS. A front surface (or an upper surface) and a rear surface (or a lower surface) of members constituting the electronic device ED may be defined on the basis of the third direction DR3.

In the present embodiment, the electronic device ED may be a mobile phone or a tablet PC and is not particularly limited. In the present embodiment, a flat-type electronic device ED is illustrated as an example, but the present disclosure is not limited thereto. For example, descriptions to be made below may be applied to various electronic devices such as a rollable-type electronic device, a slidable-type electronic device, a stretchable-type electronic device, and/or a foldable-type electronic device.

Referring to FIG. 2, the electronic device ED may include a display device DD, an electronic module EM, an electro-optical module ELM, a power module PSM, and a housing MH. The display device DD may include a display module DM and a window WM. The display module DM and the window WM may be coupled to each other by an adhesive layer.

The display device DD may include an image region DA in which an image is provided and a bezel region NDA in which an image is not provided. The image region DA may include a first region DA1, a second region DA2, and a third region DA3, which are divided according to the amount of incident light that transmits to the display device DD, that is, a transmittance of incident light. The first region DA1 may have the highest transmittance of incident light, and the third region DA3 may have the lowest transmittance of incident light. A pixel is not disposed in the first region DA1, or the first region DA1 has a relatively low pixel density than the second region DA2 and the third region DA3. In one or more embodiments, the second region DA2 may be provided in plurality.

A pixel may be disposed in the second region DA2 and the third region DA3, and the second region DA2 and the third region DA3 may have the same resolution. In addition, the second region DA2 and the third region DA3 may have the same arrangement of pixels (or arrangement of light-emitting regions). For example, pixel units may be repeatedly disposed along the second region DA2 and the third region DA3, and the pixel units may each include a first color pixel, a second color pixel, and a third color pixel. The pixel units may each include first color to third color pixels of stripe arrangement, PENTILE® arrangement, or diamond arrangement. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

The window WM provides the display surface DS of FIG. 1. The window WM may include a base layer such as glass and a bezel pattern that defines the bezel region NDA. The display module DM overlaps at least the image region DA.

Referring to FIG. 3, the display module DM may include a display panel 100 and an input sensor 200. The display panel 100 may generate an image, and the input sensor 200 may sense an external input.

Referring to FIG. 2, the electronic module EM, the electro-optical module ELM, and the power module PSM are disposed below the display device DD. The electro-optical module ELM may include a camera module CM. The camera module CM is disposed to overlap a first region DA1 and captures an image of the outside of the electronic device ED. The electro-optical module ELM may include a photo sensor PS. The photo sensor PS may be disposed to overlap a second region DA2 and receive incident light. Light incident to the photo sensor PS may be infrared light. The photo sensor PS, which receives infrared light reflected by an external object and senses approach of the external object, performs a function of a proximity sensor.

In one or more embodiments, the electro-optical module ELM may further include a light-emitting element that generates the infrared light described above. The light-emitting element may provide infrared light for an operation of the photo sensor PS to the outside of the electronic device ED through the second region DA2 illustrated in FIG. 2 or an additional second region DA2.

The power module PSM supplies power that is required for an overall operation of the electronic device ED. The power module PSM may include a typical battery device.

The housing MH is coupled to the window WM to accommodate the other modules. FIG. 2 illustrates, as an example, the housing that is configured with one member. However, the housing may include two or more components that are assembled with each other.

Referring to FIG. 3, the electronic module EM may include a control module E10, a wireless communication module E20, an image input module E30, a sound input module E40, a sound output module E50, a memory E60, an external interface module E70, and/or the like. The modules may be mounted on a circuit board or electrically connected through a flexible circuit board. The electronic module EM is electrically connected to the power module PSM.

The control module E10 controls an overall operation of the electronic device ED. For example, the control module E10 activates or deactivates the display module DM in accordance with a user's input. The control module E10 may control the image input module E30, the sound input module E40, the sound output module E50, etc., in accordance with a user's input. The control module E10 may include at least one microprocessor.

The wireless communication module E20 may transmit and/or receive a wireless signal to/from another terminal by using Bluetooth or Wi-Fi line. The wireless communication module E20 may transmit and/or receive a voice signal by using a general communication line. The wireless communication module E20 includes a transmission circuit E22 that modulates and transmits a signal to be transmitted and a reception circuit E24 that demodulates a received signal.

The image input module E30 processes an image signal and converts the image signal into image data that is displayable on the display panel 100. The sound input module E40 receives an external sound signal through a microphone in a recording mode, speech recognition mode, etc., and converts the external sound signal into electrical voice data. The sound output module E50 converts sound data that is received from the wireless communication module E20 or sound data that is stored in the memory E60 and outputs the converted sound data to the outside.

The external interface module E70 serves as an interface connected to an external charger, a wired/wireless data port, a card socket (for example, a memory card, SIM/UIM card), etc.

Figure 4:
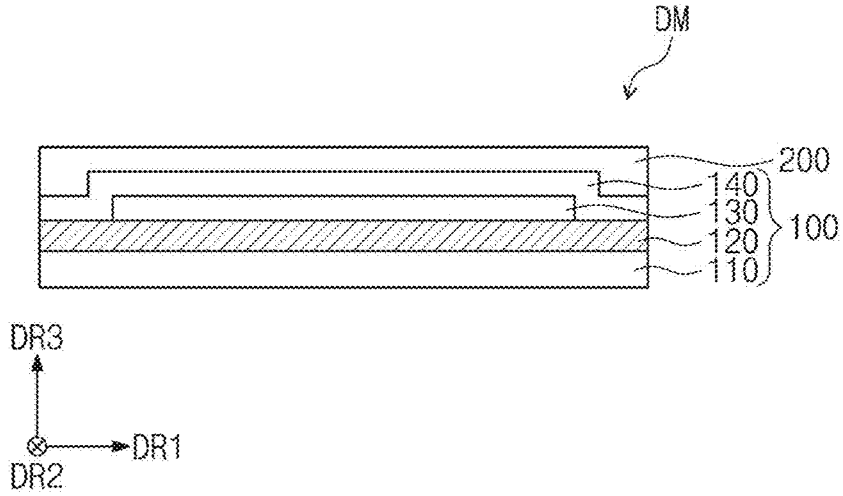
FIG. 4 is a cross-sectional view of a display module according to one or more embodiments.

FIG. 4 is a schematic cross-sectional view of a display module DM according to one or more embodiments.

Referring to FIG. 4, the display module DM may include a display panel 100 and an input sensor 200. The display panel 100 may be an emissive display panel, and for example, the display panel 100 may include an organic light-emitting display panel, an inorganic light-emitting display panel, an organic-inorganic light-emitting display panel, a quantum dot display panel, a micro-LED display panel, or a nano-LED display panel. The display panel 100 may include a base layer 110, a circuit element layer 120, a light-emitting element layer 130, and an encapsulation layer 140.

The base layer 110 may be a member that provides a base surface on which the circuit element layer 120 is disposed. The base layer 110 may have a multi-layered structure or a single-layered structure. The base layer 110 may be a glass substrate, a silicon substrate, a polymer substrate, and/or the like, but is not particularly limited thereto.

The circuit element layer 120 may be disposed on the base layer 110. The circuit element layer 120 may include an insulating layer, a semiconductor pattern, a conductive pattern, a signal line, and/or the like. An insulating layer, a semiconductor layer, and a conductive layer may be formed on the base layer 110 by coating, deposition, and/or the like, and the insulating layer, the semiconductor layer, and the conductive layer may be selectively patterned through multiple times of photolithography process. In one or more embodiments, the circuit element layer 120 may be defined as a driving element layer.

The light-emitting element layer 130 may be disposed on the circuit element layer 120. The light-emitting element layer 130 may include a light-emitting element. For example, the light-emitting element layer 130 may include an organic light-emitting material, an inorganic light-emitting material, an organic-inorganic light-emitting material, a quantum dot, a quantum rod, a micro-LED, or a nano-LED.

The encapsulation layer 140 may be disposed on the light-emitting element layer 130. The encapsulation layer 140 may protect the light-emitting element layer 130 from moisture, oxygen, and/or foreign substances such as dust particles.

The input sensor 200 may be disposed on the display panel 100. The input sensor 200 may sense an external input. The input sensor 200 may be an integrated sensor that is formed continuously in a process of manufacturing the display panel 100 or an external sensor attached to the display panel 100. The input sensor 200 may be referred to as a sensor, an input sensing layer, an input sensing panel, an electronic device for sensing an input coordinate, and/or the like.

According to one or more embodiments, the input sensor 200 may sense all of an input from a user's body and an input from an input mean (e.g., an input device) that generates a magnetic field of a suitable resonant frequency (e.g., a predetermined resonant frequency). In one or more embodiments, the input means that generates a magnetic field of a suitable resonant frequency (e.g., a predetermined resonant frequency) may be referred to as a pen (PN), an input pen, a magnetic pen, a stylus pen, or an electromagnetic resonance pen.

Figure 5:
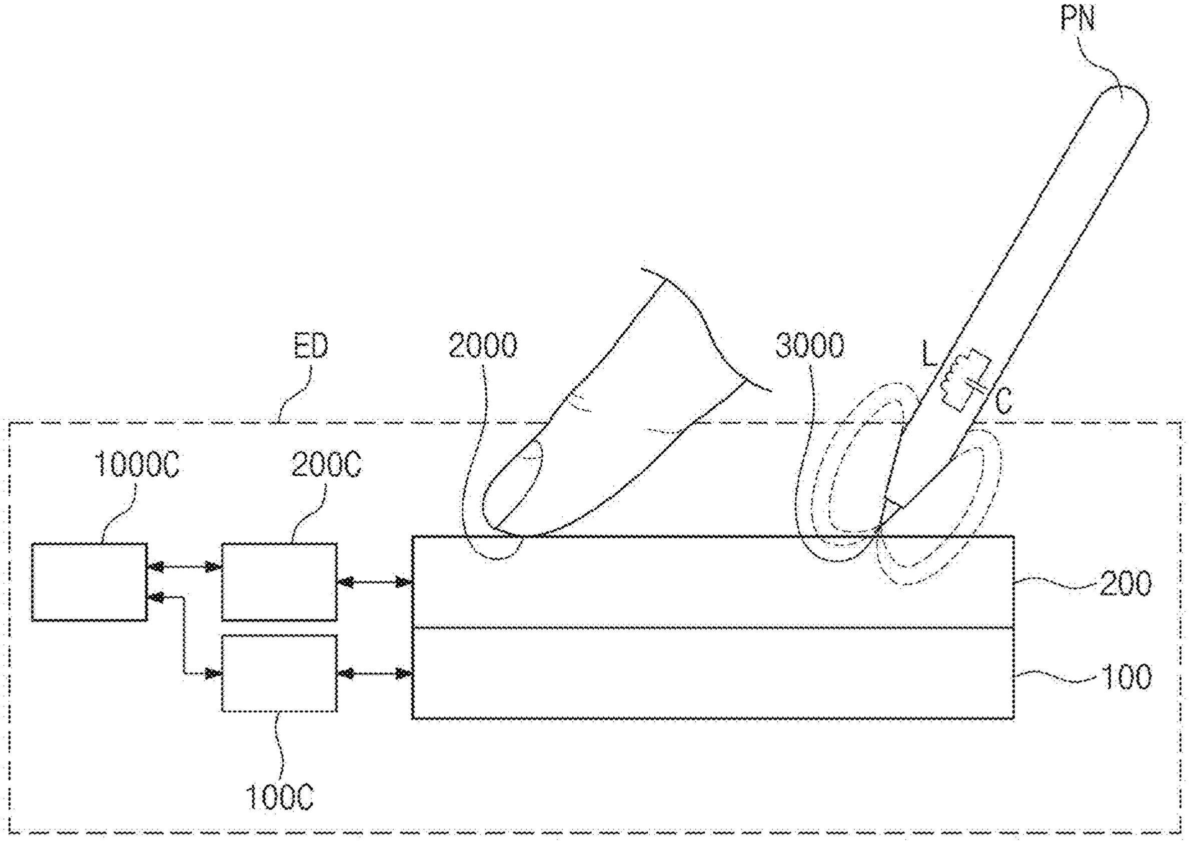
FIG. 5 is a diagram for describing an operation of an electronic device according to one or more embodiments.

FIG. 5 is a diagram for describing an operation of an electronic device ED according to one or more embodiments.

Referring to FIG. 5, the electronic device ED may include a display panel 100, an input sensor 200, a panel driving circuit 100C, a sensor driving circuit 200C, and a main driving circuit 1000C. The panel driving circuit 100C, the sensor driving circuit 200C, and the main driving circuit 1000C may be included in the control module E10 of FIG. 3.

The input sensor 200 may sense a first input 2000 and/or a second input 3000 applied from the outside. Each of the first input 2000 and the second input 3000 may be from an input means that may provide a change in capacitance of the input sensor 200 or an input means that may cause induced current in the input sensor 200. For example, the first input 2000 may be from an input means that may provide a charge. The second input 3000 may be an input from a pen PN or an input from an RFIC tag. For example, the pen PN may be a passive-type pen or an active-type pen.

In one or more embodiments, the pen PN may be a device that generates a magnetic field of a suitable resonant frequency (e.g., a predetermined resonant frequency). The pen PN may be configured to transmit an output signal based on an electromagnetic resonance method. The pen PN may be referred to as an input pen, a magnetic pen, a stylus pen, or an electromagnetic resonance pen.

The pen PN may include an RLC resonant circuit, and the RLC resonant circuit may include an inductor L and a capacitor C. The RLC resonant circuit may also include a resistor. In one or more embodiments, the RLC resonant circuit may be a variable resonant circuit that varies a resonant frequency. In this case, the inductor L may be a variable inductor and/or the capacitor C may be a variable capacitor, but the present disclosure is not particularly limited thereto.

The inductor L generates current due to a magnetic field that is formed in the input sensor 200. However, the present disclosure is not particularly limited thereto. For example, in a case in which the pen PN operates as an active type, the pen PN may generate current even if the pen PN is not provided with a magnetic field from the outside. The generated current is transmitted to the capacitor C. The capacitor C is charged with current input from the inductor L and discharges charged current to the inductor L. Thereafter, the inductor L may emit a magnetic field of a suitable resonant frequency. Induced current may flow through the input sensor 200 due to the magnetic field that is emitted by the pen PN, and the induced current may be transmitted to the sensor driving circuit 200C as a reception signal (or a sensing signal).

The panel driving circuit 100C may drive the display panel 100. The panel driving circuit 100C may receive image data and a control signal from the main driving circuit 1000C. The control signal may include various signals. For example, the control signal may include an input vertical synchronization signal, an input horizontal synchronization signal, a main clock, a data enable signal, and/or the like.

The sensor driving circuit 200C may drive the input sensor 200. The sensor driving circuit 200C may receive a control signal from the main driving circuit 1000C. The control signal may include a clock signal of the sensor driving circuit 200C. In addition, the control signal may further include a mode determination signal that determines a driving mode of the input sensor 200 and the sensor driving circuit 200C.

The sensor driving circuit 200C may be embodied as an integrated circuit (IC), which is distinguished from the control module E10 of FIG. 3, and electrically connected to the input sensor 200. For example, the sensor driving circuit 200C may be directly mounted in a suitable region (e.g., a predetermined region) of the display panel 100 or mounted on a separate printed circuit board (PCB) using a chip-on-film (COF) method and electrically connected to the input sensor 200.

The sensor driving circuit 200C may selectively operate the input sensor 200 in a first mode or a second mode. For example, the first mode may be a mode for sensing a touch input, for example, the first input 2000. The second mode may be a mode for sensing an input of the pen PN, for example, the second input 3000. The first mode may be referred to as a touch sensing mode, and the second mode may be referred to as a pen sensing mode.

Switching between the first mode and the second mode may be performed in various ways. For example, the sensor driving circuit 200C and the input sensor 200 may be driven in the first mode and the second mode in a time-division manner and sense the first input 2000 and the second input 3000. Alternatively, switching between the first mode and the second mode may be caused by a user's selection or a user's specific action, or any one of the first mode or the second mode may be activated or deactivated, or may be switched to the other by activation or deactivation of a specific application. Alternatively, while the sensor driving circuit 200C and the input sensor 200 are operating alternately in the first mode and the second mode, when the first input 2000 is sensed, the first mode may be maintained, or when the second input 3000 is sensed, the second mode may be maintained.

The sensor driving circuit 200C may calculate coordinate information about an input on the basis of a signal received from the input sensor 200 and provide a coordinate signal having coordinate information to the main driving circuit 1000C. The main driving circuit 1000C executes an operation corresponding to a user's input on the basis of the coordinate signal. For example, the main driving circuit 1000C may operate the panel driving circuit 100C so that a new application image is displayed on the display panel 100.

Figure 6:
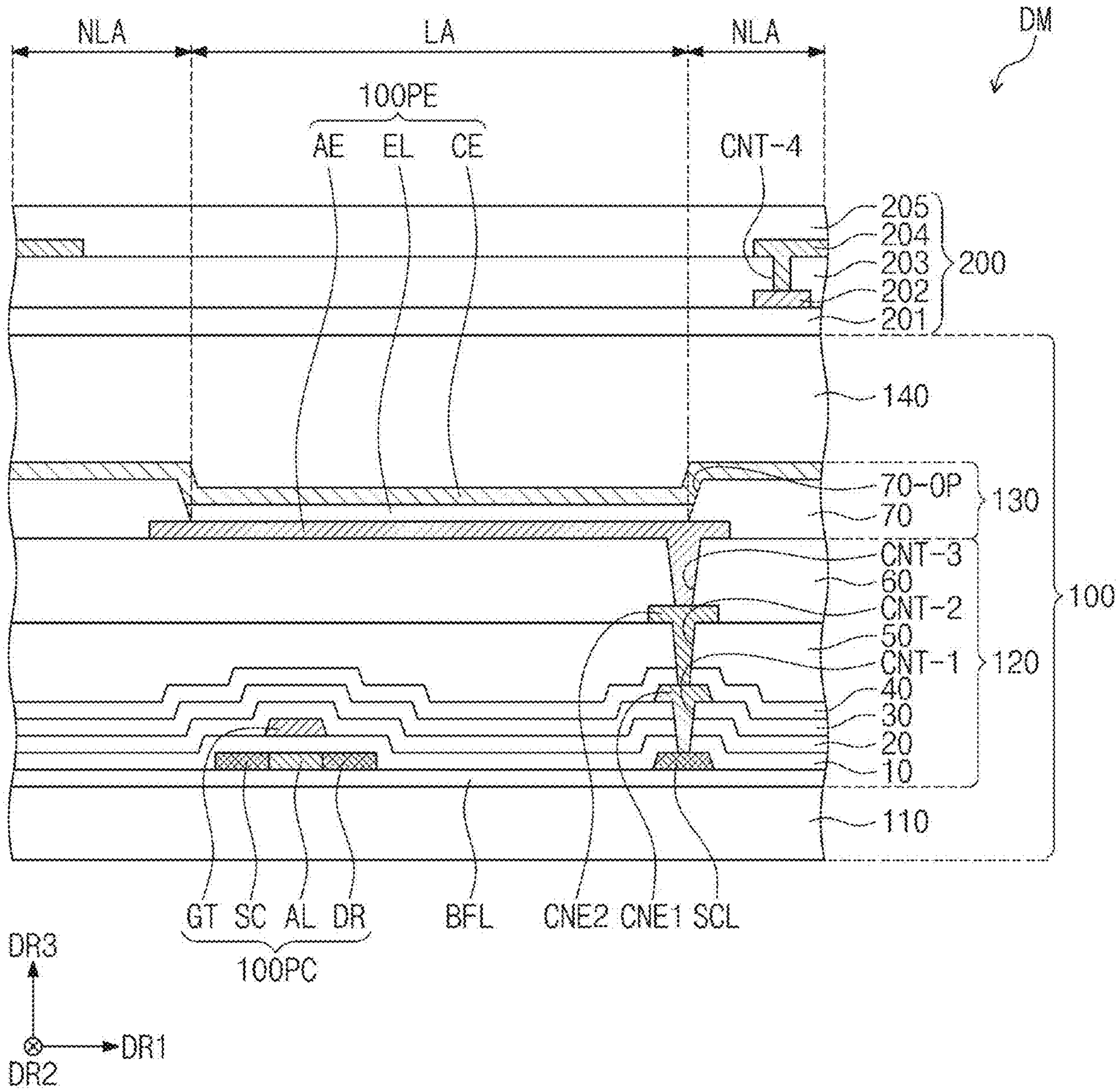
FIG. 6 is a cross-sectional view of a display module according to one or more embodiments.

FIG. 6 is a cross-sectional view of a display module DM according to one or more embodiments.

Referring to FIG. 6, at least one buffer layer BFL is disposed on an upper surface of a base layer 110. The buffer layer BFL may improve bonding force between the base layer 110 and a semiconductor pattern. A display panel 100 may further include a barrier layer. The buffer layer BFL may include silicon oxide, silicon nitride, and/or silicon oxynitride. For example, the buffer layer BFL may include a structure in which a silicon oxide layer and a silicon nitride layer are alternately stacked.

A semiconductor pattern SC, AL, DR, and SCL may be disposed on the buffer layer BFL. The semiconductor pattern SC, AL, DR, and SCL may include polysilicon. However, the present disclosure is not limited thereto, and the semiconductor pattern SC, AL, DR, and SCL may include amorphous silicon, low-temperature polycrystalline silicon, and/or an oxide semiconductor.

FIG. 6 merely illustrates a partial semiconductor pattern SC, AL, DR, and SCL, and another semiconductor pattern may be further disposed in another region. The semiconductor pattern SC, AL, DR, and SCL may be arranged according to a specific rule across pixels. The semiconductor pattern SC, AL, DR, and SCL may have a different electrical property according to whether the semiconductor pattern is doped or not. The semiconductor pattern SC, AL, DR, and SCL may include a first region SC, DR, and SCL having high conductivity and a second region AL having low conductivity. The first region SC, DR, and SCL may be doped with an N-type dopant or a P-type dopant. A P-type transistor may include a doped region doped with a P-type dopant, and an N-type transistor may include a doped region doped with an N-type dopant. The second region AL may be an undoped region or a region doped at a lower concentration compared to the first region.

The first region SC, DR, and SCL may have higher conductivity than the second region AL and substantially serve as an electrode or a signal line. The second region AL may substantially correspond to an active region AL (or a channel) of a transistor 100PC. In other words, a portion of the semiconductor patterns SC, AL, DR, and SCL may be the active region AL of the transistor 100PC, another portion thereof may be a source region SC or a drain region DR of the transistor 100PC, and still another portion thereof may be a connection electrode or a connection signal line SCL.

Each of pixels may have an equivalent circuit including seven transistors, one capacitor, and a light-emitting element, and an equivalent circuit diagram of a pixel may be changed in various forms. FIG. 6 illustrates, as an example, one transistor 100PC and a light-emitting element 100PE included in a pixel.

The source region SC, the active region AL, and the drain region DR of the transistor 100PC may be formed from the semiconductor pattern SC, AL, DR, and SCL. The source region SC and the drain region DR may extend in opposite directions from the active region AL in a cross-sectional view. FIG. 6 illustrates a portion of the connection signal line SCL which is formed from the semiconductor pattern SC, AL, DR, and SCL. In one or more embodiments, the connection signal line SCL may be connected to the drain region DR of the transistor 100PC in a plan view.

A first insulating layer 10 may be disposed on the buffer layer BFL. The first insulating layer 10 may overlap a plurality of pixels in common and cover the semiconductor pattern SC, AL, DR, and SCL. The first insulating layer 10 may be an inorganic layer and/or an organic layer and have a single-layered or multi-layered structure. The first insulating layer 10 may include aluminum oxide, titanium oxide, silicon oxide, silicon nitride, silicon oxynitride, zirconium oxide, and/or hafnium oxide. In the present embodiment, the first insulating layer 10 may be a single-layered silicon oxide layer. Not only the first insulating layer 10 but also an insulating layer of a circuit element layer 120 to be described later may be an inorganic layer and/or an organic layer and have a single-layered or multi-layered structure. The inorganic layer may include at least one of the materials described above, but the present disclosure is not limited thereto.

A gate GT of the transistor 100PC is disposed on the first insulating layer 10. The gate GT may be a portion of a metal pattern. The gate GT overlaps the active region AL in the third direction DR3 (e.g., a thickness direction of the display panel 100). The gate GT may function as a mask in a process of doping or reducing the semiconductor pattern SC, AL, DR, and SCL.

A second insulating layer 20 may be disposed on the first insulating layer 10 and cover the gate GT. The second insulating layer 20 may overlap pixels in common. The second insulating layer 20 may be an inorganic layer and/or an organic layer and have a single-layered or multi-layered structure. The second insulating layer 20 may include silicon oxide, silicon nitride, and/or silicon oxynitride. In the present embodiment, the second insulating layer 20 may have a multi-layered structure including a silicon oxide layer and a silicon nitride layer.

A third insulating layer 30 may be disposed on the second insulating layer 20. The third insulating layer 30 may have a single-layered or multi-layered structure. For example, the third insulating layer 30 may have a multi-layered structure including a silicon oxide layer and a silicon nitride layer.

A first connection electrode CNE1 may be disposed on the third insulating layer 30. The first connection electrode CNE1 may be connected to the connection signal line SCL through a contact hole CNT-1 penetrating the first, second, and third insulating layers 10, 20, and 30.

A fourth insulating layer 40 may be disposed on the third insulating layer 30 and cover the first connection electrode CNE1. The fourth insulating layer 40 may be a single-layered silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 may be disposed on the fifth insulating layer 50 and cover the second connection electrode CNE2. The sixth insulating layer 60 may be an organic layer.

A light-emitting element layer 130 may be disposed on the circuit element layer 120. The light-emitting element layer 130 may include the light-emitting element 100PE. For example, the light-emitting element layer 130 may include an organic light-emitting material, an inorganic light-emitting material, an organic-inorganic light-emitting material, a quantum dot, a quantum rod, a micro-LED, or a nano-LED. Hereinafter, the light-emitting element 100PE will be described as an organic light-emitting element as an example, but is not particularly limited thereto.

The light-emitting element 100PE may include a first electrode AE, an emission layer EL, and a second electrode CE. The first electrode AE may be disposed on the sixth insulating layer 60. The first electrode AE may be connected to the second connection electrode CNE2 through a contact hole CNT-3 penetrating the sixth insulating layer 60. In the present embodiment, the first electrode AE may be an anode, and the second electrode CE may be a cathode.

A pixel-defining film 70 may be disposed on the sixth insulating layer 60 and cover a portion of the first electrode AE. An opening 70-OP is defined in the pixel-defining film 70. The opening 70-OP of the pixel-defining film 70 exposes at least a portion of the first electrode AE.

The display panel 100 may include a light-emitting region LA and a non-light-emitting region NLA adjacent to the light-emitting region LA. The non-light-emitting region NLA may be around (e.g., may surround) the light-emitting region LA. In the present embodiment, the light-emitting region LA is defined in correspondence to a partial region of the first electrode AE exposed by the opening 70-OP.

The emission layer EL may be disposed on the first electrode AE. The emission layer EL may be disposed in a region corresponding to the opening 70-OP. That is, the emission layer EL may be separately formed in each of pixels. In a case in which the emission layer EL is separately formed in each of the pixels, each emission layer EL may emit light having at least one of blue, red, or green color. However, the present disclosure is not limited thereto, and the emission layer EL may be connected to pixels and included in common. In this case, the emission layer EL may provide blue light or white light.

The second electrode CE may be disposed on the emission layer EL. The second electrode CE may have an integrated shape and may be included in a plurality of pixels in common.

In one or more embodiments, a hole control layer may be disposed between the first electrode AE and the emission layer EL. The hole control layer may be disposed in common in the light-emitting region LA and the non-light-emitting region NLA. The hole control layer may include a hole transport layer and may further include a hole injection layer. An electron control layer may be disposed between the emission layer EL and the second electrode CE. The electron control layer may include an electron transport layer and may further include an electron injection layer. The hole control layer and the electron control layer may be formed in common in a plurality of pixels by using an open mask and/or an inkjet process.

An encapsulation layer 140 may be disposed on the light-emitting element layer 130. The encapsulation layer 140 may include an inorganic layer, an organic layer, and an inorganic layer that are sequentially stacked, but layers constituting the encapsulation layer 140 are not limited thereto. The inorganic layers may protect the light-emitting element layer 130 from moisture and/or oxygen, and the organic layer may protect the light-emitting element layer 130 from foreign substances such as dust particles. The inorganic layers may include a silicon nitride layer, a silicon oxynitride layer, a silicon oxide layer, a titanium oxide layer, an aluminum oxide layer, and/or the like. The organic layer may include an acrylic organic layer and is not limited thereto.

An input sensor 200 may include a first insulating layer 201, a first conductive layer 202, a second insulating layer 203, a second conductive layer 204, and a third insulating layer 205 arranged along the third direction DR3. The first insulating layer 201 may be an inorganic layer including silicon nitride, silicon oxynitride, and/or silicon oxide. Alternatively, the first insulating layer 201 may be an organic layer including an epoxy resin, an acryl resin, and/or an imide-based resin. The first insulating layer 201 may have a single-layered structure or a multi-layered structure in which layers are stacked along the third direction DR3.

The first conductive layer 202 and the second conductive layer 204 may each include a plurality of conductive patterns. The first conductive layer 202 and the second conductive layer 204 may each have a single-layered structure or a multi-layered structure in which layers are stacked along the third direction DR3. A conductive pattern of the second conductive layer 204 may be connected to a conductive pattern of the first conductive layer 202 through a contact hole CNT-4 penetrating the second insulating layer 203.

The first conductive layer 202 and the second conductive layer 204 having a single-layered structure may each include a metal layer or a transparent conductive layer. The metal layer may include molybdenum, silver, titanium, copper, aluminum, or alloy thereof. The transparent conductive layer may include transparent conductive oxide such as indium tin oxide (ITO), indium zinc oxide (IZO), zinc oxide (ZnO), and/or indium zinc tin oxide (IZTO). In addition, the transparent conductive layer may include a conductive polymer such as poly(3,4-ethylenedioxythiophene) (PEDOT), metal nanowire, graphene, etc.

The first conductive layer 202 and the second conductive layer 204 having a multi-layered structure may each include metal layers. For example, the metal layers may have a triple-layered structure of titanium/aluminum/titanium. The conductive layer having a multi-layered structure may include at least one metal layer and at least one transparent conductive layer.

At least any one of the second insulating layer 203 or the third insulating layer 205 may include an inorganic film. The inorganic film may include at least one of aluminum oxide, titanium oxide, silicon oxide, silicon nitride, silicon oxynitride, zirconium oxide, or hafnium oxide.

At least any one of the second insulating layer 203 or the third insulating layer 205 may include an organic film. The organic film may include an acrylic resin, a methacrylic resin, a polyisoprene-based resin, a vinyl-based resin, an epoxy-based resin, a urethane-based resin, a cellulose-based resin, a siloxane-based resin, a polyimide-based resin, a polyamide-based resin, and/or a perylene-based resin.

In the present embodiment, the input sensor 200 including three insulating layers 201, 203, and 205 and two conductive layers 202 and 204 is described as an example, but the present disclosure is not limited thereto. The input sensor 200 may include four insulating layers and three conductive layers, or may include five insulating layers and four conductive layers. Some among a plurality of conductive layers and a plurality of insulating layers may be disposed below the base layer 110.

Figure 7:
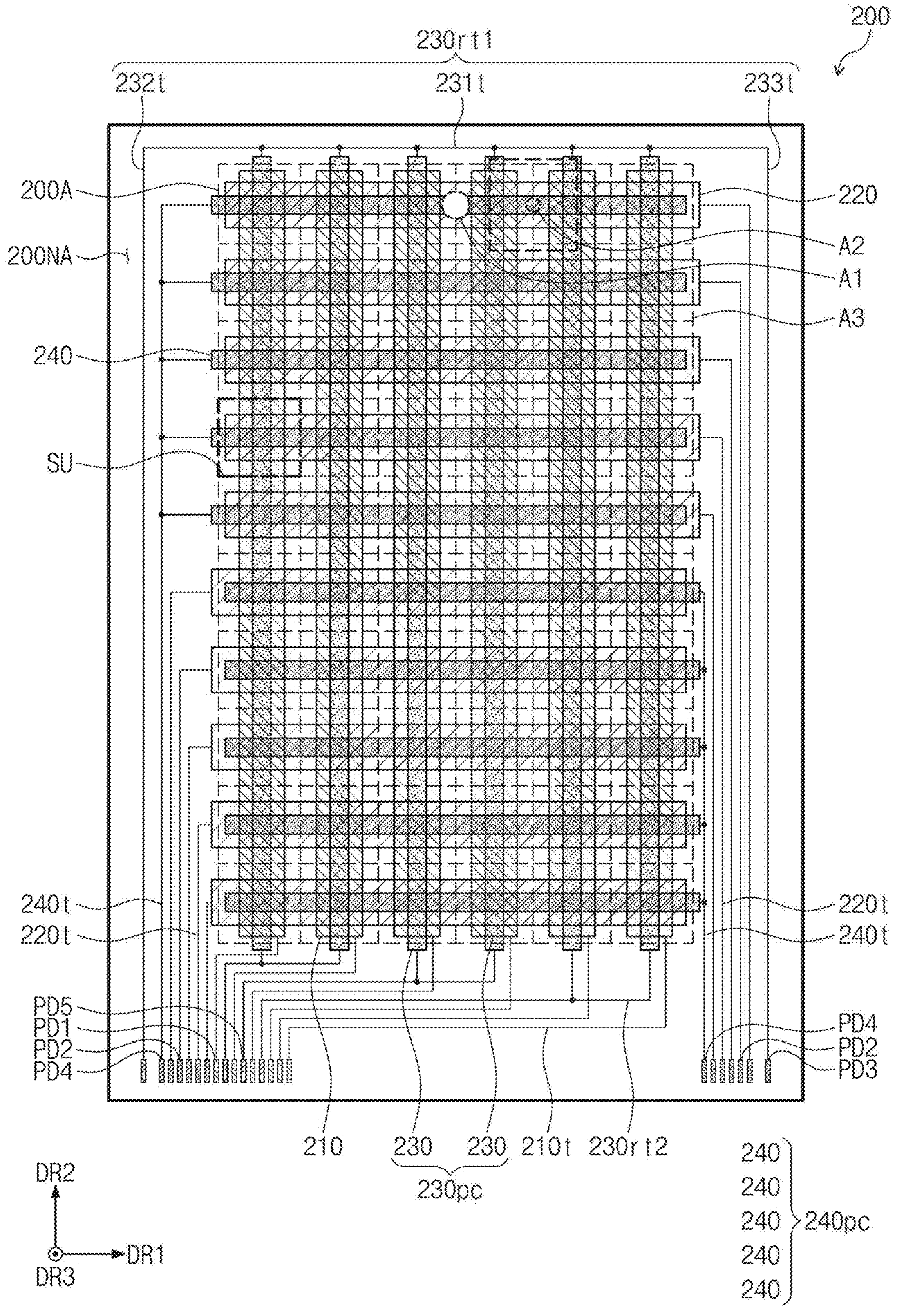
FIG. 7 is a plan view of an input sensor according to one or more embodiments.
Figure 8A:
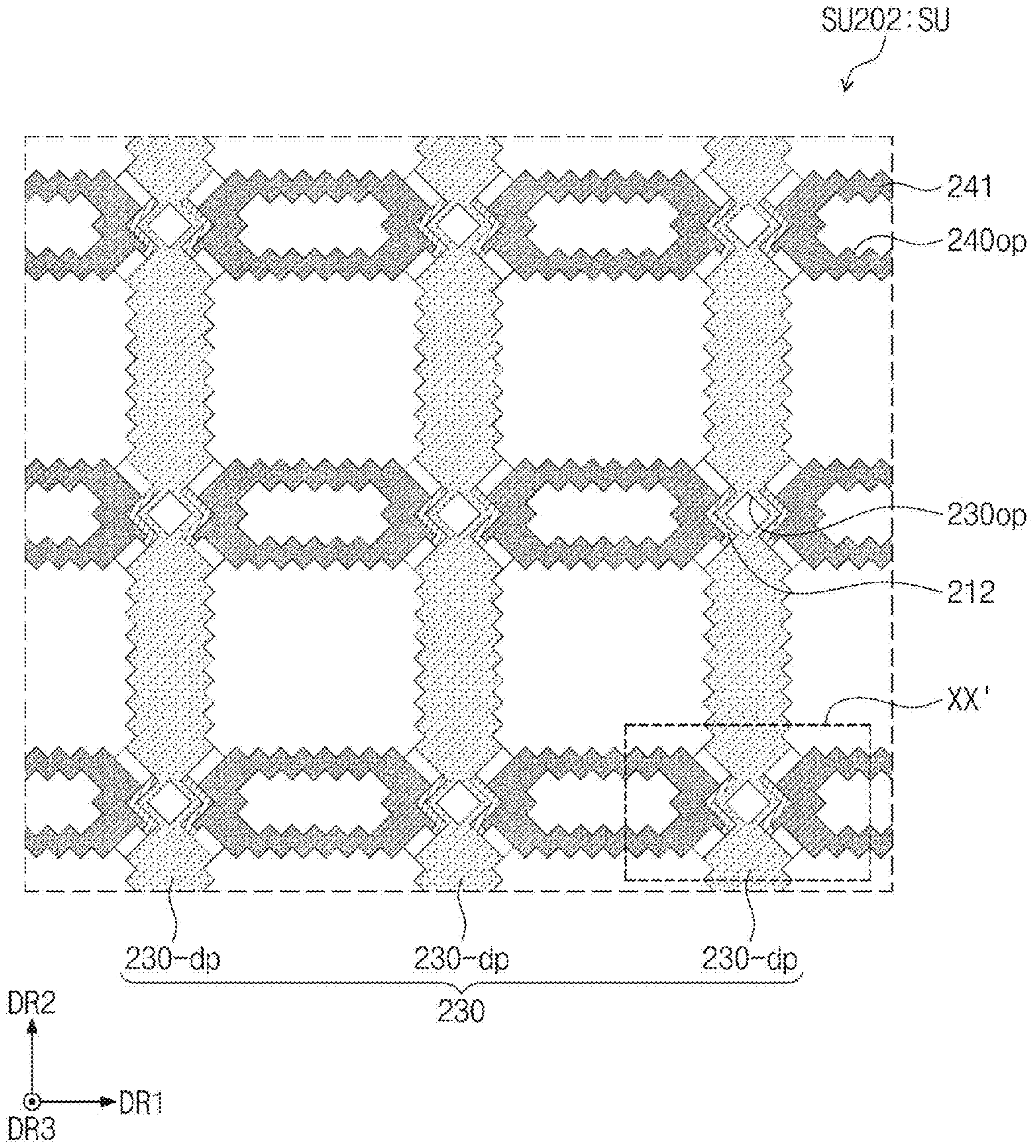
FIG. 8A is a plan view illustrating a first conductive layer of a sensing unit according to one or more embodiments.
Figure 8B:
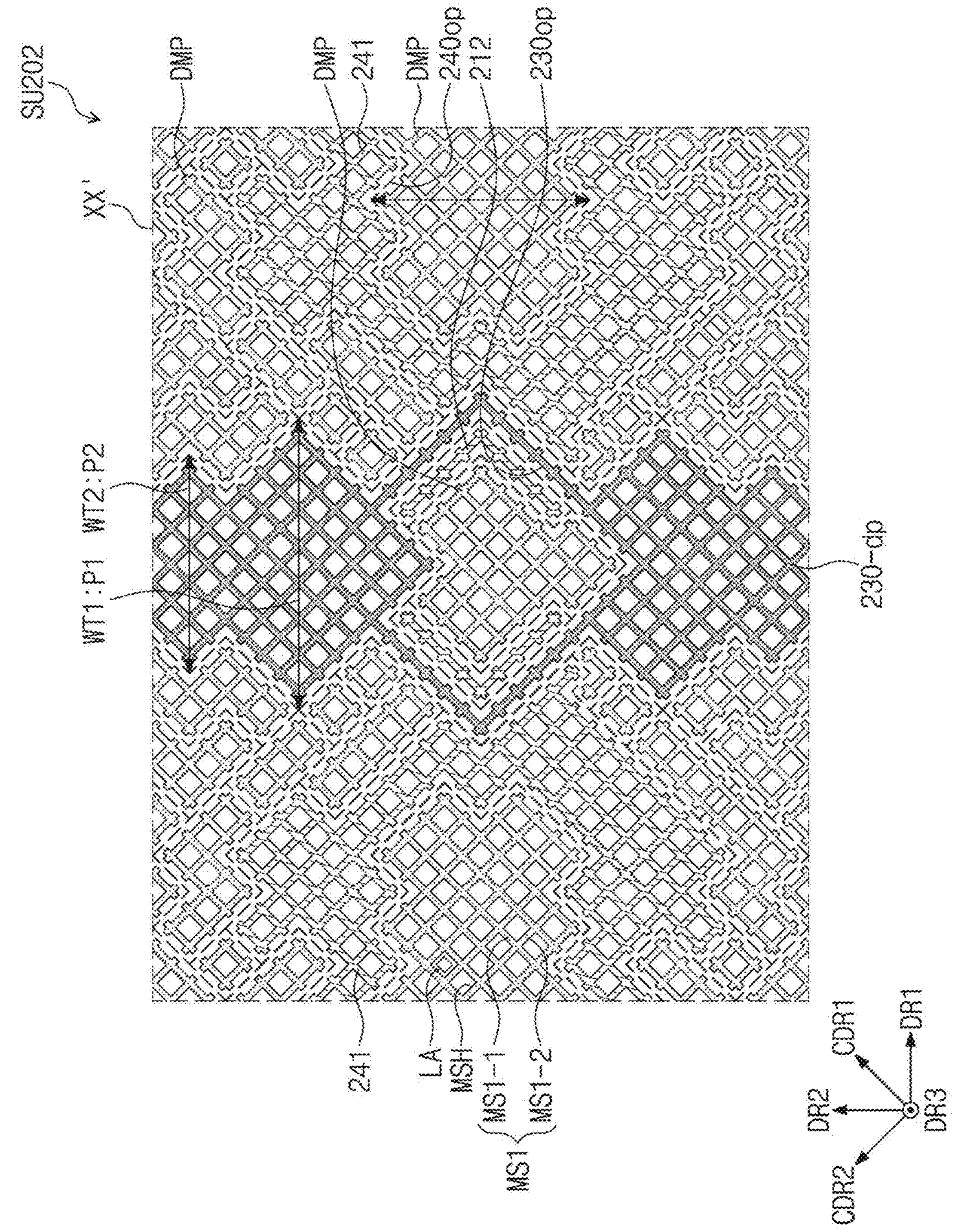
FIG. 8B is an enlarged plan view of a first region illustrated in FIG. 8A.
Figure 9A:
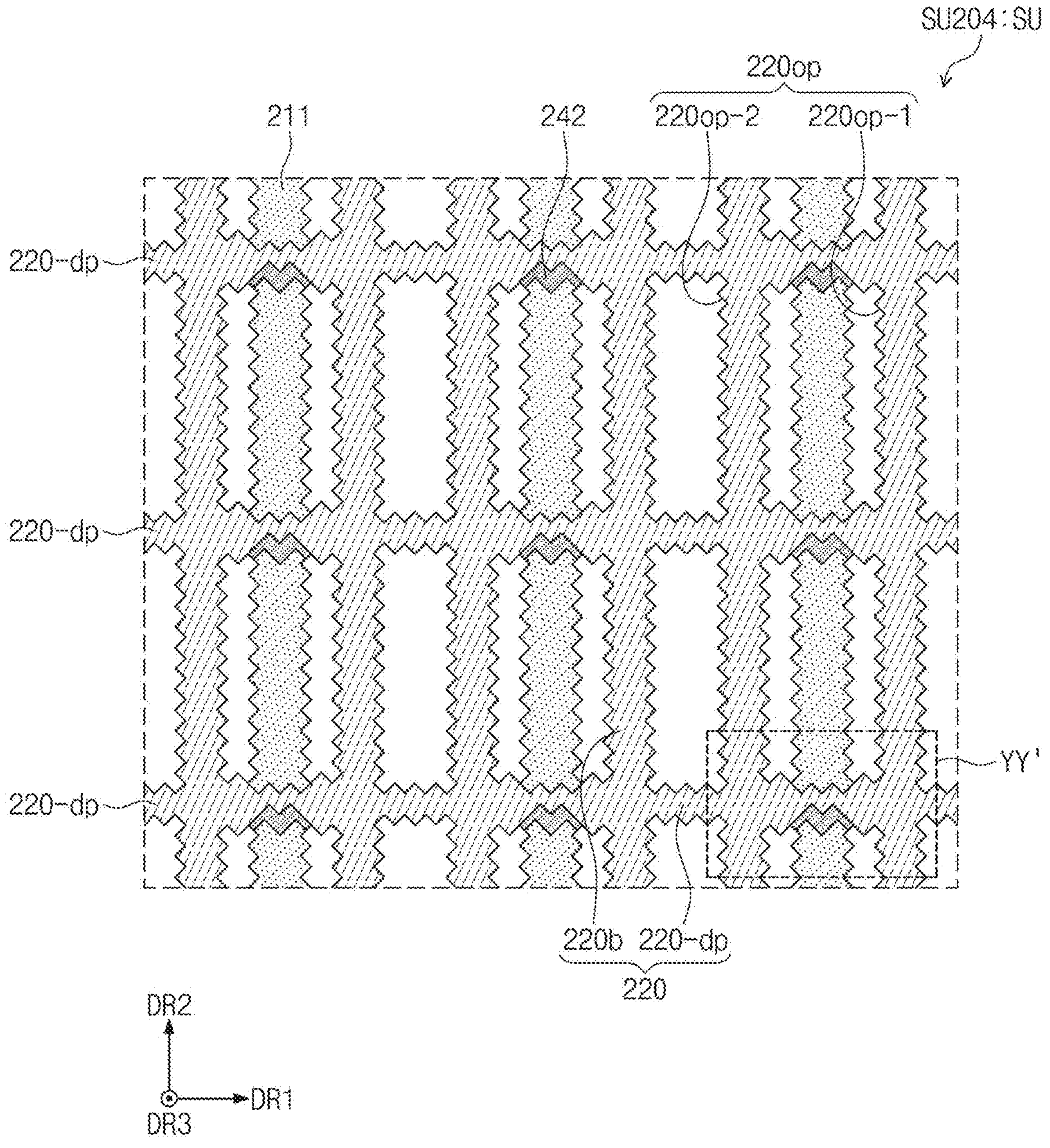
FIG. 9A is a plan view illustrating a second conductive layer of a sensing unit according to one or more embodiments.
Figure 9B:
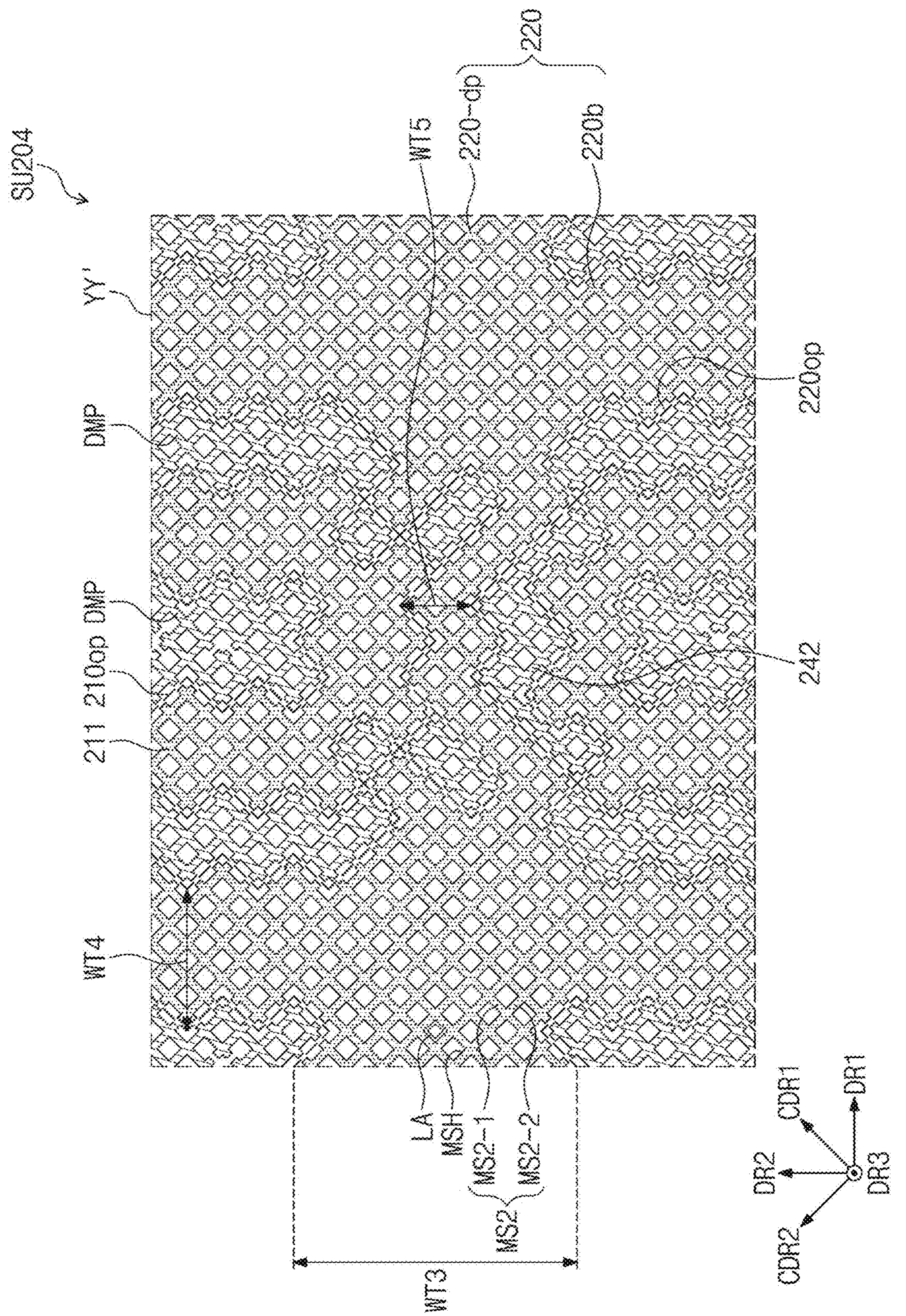
FIG. 9B is an enlarged plan view of a second region illustrated in FIG. 9A.

FIG. 7 is a plan view of an input sensor 200 according to one or more embodiments. FIG. 8A is a plan view illustrating a first conductive layer SU202 of a sensing unit SU according to one or more embodiments. FIG. 8B is an enlarged plan view of a first region XX' illustrated in FIG. 8A. FIG. 9A is a plan view illustrating a second conductive layer SU204 of a sensing unit SU according to one or more embodiments. FIG. 9B is an enlarged plan view of a second region YY' illustrated in FIG. 9A.

Referring to FIG. 7, the input sensor 200 may include a sensing region 200A and a peripheral region 200NA adjacent to the sensing region 200A. The sensing region 200A may correspond to the image region DA of FIG. 2, and the peripheral region 200NA may correspond to the bezel region NDA of FIG. 2.

The input sensor 200 may include a plurality of first electrodes 210, a plurality of second electrodes 220, a plurality of third electrodes 230, and a plurality of fourth electrodes 240, which are disposed in the sensing region 200A. In the present embodiment, four types of electrodes distinguished from each other are separately referred to as the first electrodes 210, the second electrodes 220, the third electrodes 230, and the fourth electrodes 240, and names of four types of electrodes may be changed.

The first electrodes 210 may each cross the second electrodes 220. The first electrodes 210 may each extend along the second direction DR2 and may be arranged to be spaced (e.g., spaced apart) from each other in the first direction DR1. The second electrodes 220 may each extend along the first direction DR1 and may be arranged to be spaced (e.g., spaced apart) from each other in the second direction DR2.

The sensing region 200A may include a plurality of sensing units SU. The sensing units SU may each include a region in which one first electrode 210 and one second electrode 220 cross each other. FIG. 7 illustrates, as an example, six first electrodes 210, ten second electrodes 220, and sixty sensing units SU, but the number of first electrodes 210 and the number of second electrodes 220 are not limited thereto.

The third electrodes 230 may each extend along the second direction DR2 and may be arranged to be spaced (e.g., spaced apart) from each other in the first direction DR1. One third electrode 230 may at least partially overlap one first electrode 210. According to one or more embodiments, a capacitance (or a coupling capacitance) between one first electrode 210 and one third electrode 230 may be adjusted by adjusting an overlapping area of one first electrode 210 and one third electrode 230.

In one or more embodiments, at least some of the third electrodes 230 may be connected to each other in parallel. For example, FIG. 7 illustrates that two third electrodes 230 are connected to each other in parallel and constitute a first electrode group 230*pc* as an example, and three first electrode groups 230*pc* may be arranged along the first direction DR1. However, the number of third electrodes 230 constituting the first electrode group 230*pc* is not limited thereto. For example, one first electrode group 230*pc* may include only one third electrode 230 or include three or more third electrodes 230.

As the number of third electrodes 230 included in the first electrode group 230*pc* and connected to each other in parallel increases, resistance of the first electrode group 230*pc* is reduced, and thus power efficiency and sensing sensitivity may be improved. In contrast, as the number of third electrodes 230 included in the first electrode group 230*pc* decreases, a loop coil pattern which is formed using the first electrode group 230*pc* may be implemented in further various forms.

The fourth electrodes 240 may be arranged along the second direction DR2 and may extend along the first direction DR1. One fourth electrode 240 may at least partially overlap one second electrode 220. According to one or more embodiments, a capacitance (or a coupling capacitance) between one second electrode 220 and one fourth electrode 240 may be adjusted by adjusting an overlapping area of one second electrode 220 and one fourth electrode 240.

In one or more embodiments, at least some of the fourth electrodes 240 may be electrically connected to each other and constitute one second electrode group 240*pc*. For example, FIG. 7 illustrates that five fourth electrodes 240 are connected to the same one trace line, for example, a fourth trace line 240*t*, and constitute one second electrode group 240*pc* as an example. Thus, FIG. 7 illustrates that two second electrode groups 240*pc* are arranged along the second direction DR2. However, the number of fourth electrodes 240 constituting one second electrode group 240*pc* is not limited thereto. For example, the number of fourth electrodes 240 constituting one second electrode group 240*pc* may be ten, and in this case, the input sensor 200 may include only one second electrode group 240*pc*.

The sensing region 200A may include a first region A1 corresponding to the first region DA1 of FIG. 2, a second region A2 corresponding to the second region DA2 of FIG. 2, and a third region A3 corresponding to the third region DA3 of FIG. 2. Because the first region A1 and the second region A2 are regions having an additional function other than a basic function of the input sensor 200 sensing an external input, there is no need for the first region A1 and the second region A2 to have a large area. The first region A1 and the second region A2 have a smaller area than the third region A3, which performs the basic function of the input sensor 200.

The first region A1 is a region in which density of the first electrodes 210, the second electrodes 220, the third electrodes 230, and the fourth electrodes 240 is the lowest and a transmittance of incident light is the highest. One or more of the first electrodes 210, the second electrodes 220, the third electrodes 230, and the fourth electrodes 240 may not be disposed in the first region A1, and two disconnected portions of an electrode disconnected by the first region A1 may be electrically connected through a periphery of the first region A1.

A corresponding electrode from among the first electrodes 210, the second electrodes 220, the third electrodes 230, and the fourth electrodes 240 is disposed in the second region A2 and the third region A3. Density of electrodes may be lower in the second region A2 than the third region A3, or a line width of a line component constituting an electrode may be smaller in the second region A2 than the third region A3. Accordingly, the second region A2 may have higher transmittance of incident light than the third region A3. Detailed description thereof will be made later.

The input sensor 200 may further include a plurality of first trace lines 210*t*, a plurality of first pads PD1 connected, in one-to-one correspondence, to the first trace lines 210*t*, a plurality of second trace lines 220*t*, and a plurality of second pads PD2 connected, in one-to-one correspondence, to the second trace lines 220*t*, which are disposed in the peripheral region 200NA. The first trace lines 210*t* may be electrically connected to the first electrodes 210 in one-to-one correspondence. The second trace lines 220*t* may be electrically connected to the second electrodes 220 in one-to-one correspondence.

The input sensor 200 may further include a third trace line 230*rt*1, two third pads PD3 connected to one end and the other end of the third trace line 230*rt*1, fourth trace lines 240*t*, fourth pads PD4 connected, in one-to-one correspondence, to the fourth trace lines 240*t*, fifth trace lines 230*rt*2, and fifth pads PD5 connected, in one-to-one correspondence, to the fifth trace lines 230*rt*2, which are disposed in the peripheral region 200NA.

The third trace line 230*rt*1 may be electrically connected to one end of each of the third electrodes 230 and electrically connect the third electrodes 230. The third trace line 230*rt*1 may include a first line portion 231*t* extending along the first direction DR1 and electrically connected to the third electrodes 230, a second line portion 232*t* extending from a first end portion of the first line portion 231*t* along the second direction DR2, and a third line portion 233*t* extending from a second end portion of the first line portion 231*t* along the second direction DR2.

FIG. 7 illustrates the first line portion 231*t*, the second line portion 232*t*, and the third line portion 233*t* each in a linear shape, but the present disclosure is not limited thereto. The first line portion 231*t*, the second line portion 232*t*, and the third line portion 233*t* may each include multiple inflection points and have a shape in which a plurality of separate portions extend.

In one or more embodiments, resistance of the second line portion 232*t* and resistance of the third line portion 233*t* may be each substantially the same as resistance of one of the third electrodes 230. Thus, the second line portion 232*t* and the third line portion 233*t* may serve as the third electrodes 230, and the same effect as if the third electrodes 230 were also disposed in the peripheral region 200NA may be obtained. For example, one of the second line portion 232*t* or the third line portion 233*t* and one of the third electrodes 230 may form a coil. Thus, a pen positioned in a region adjacent to the peripheral region 200NA may be also sufficiently charged through a loop including the second line portion 232*t* or the third line portion 233*t*.

In one or more embodiments, a width in the first direction DR1 of each of the second line portion 232*t* and the third line portion 233*t* may be adjusted so as to adjust resistance of the second line portion 232*t* and resistance of the third line portion 233*t*. However, this is merely an example, and the first to third line portions 231*t*, 232*t*, and 233*t* may have substantially the same width.

The fifth trace lines 230*rt*2 may be connected to the first electrode groups 230*pc* in one-to-one correspondence. That is, the number of fifth trace lines 230*rt*2 may correspond to the number of first electrode groups 230*pc*. FIG. 7 illustrates, as an example, three fifth trace lines 230*rt*2 and three first electrode groups 230*pc*.

In one or more embodiments, the fifth trace lines 230*rt*2 and the fifth pads PD5 may be omitted, and a charge driving mode for charging a pen may be omitted. In this case, the input sensor 200 may sense an input from an active type pen capable of emitting a magnetic field even if a magnetic field is not provided from the input sensor 200.

The fourth trace lines 240*t* may be spaced (e.g., spaced apart) with the sensing region 200A therebetween. The fourth trace lines 240*t* may be electrically connected to the second electrode groups 240*pc* in one-to-one correspondence. FIG. 7 illustrates that two second electrode groups 240*pc* are arranged as an example. The fourth trace line 240*t* connected to one second electrode group 240*pc* and the fourth trace line 240*t* connected to another second electrode group 240*pc* may be spaced (e.g., spaced apart) with the sensing region 200A therebetween. However, the present disclosure is not particularly limited thereto.

Hereinafter, an operation of the input sensor 200 will be described in more detail with reference to FIG. 7. The input sensor 200 may operate in a mutual capacitance detecting mode in a first mode and sense a touch input.

The sensor driving circuit 200C (see FIG. 5) may sequentially provide a transmission signal (or a driving signal) to the second electrodes 220 and detect a coordinate based on the first input 2000 (see FIG. 5) by using a reception signal (or a sensing signal) detected through the first electrodes 210. For example, the sensor driving circuit 200C may sense a change in mutual capacitance between capacitively coupled first electrodes 210 and second electrodes 220 and calculate a coordinate based on the first input 2000.

During a charge driving mode of a second mode, three first electrode groups 230*pc* form three channels. In addition, the second line portion 232*t* and the third line portion 233*t* each form a channel. The five channels described above may operate during the charge driving mode of the second mode. The sensor driving circuit 200C (see FIG. 5) selects and drives two of the five channels in the charge driving mode. Two channels may be adjacent to each other, but another channel may be disposed therebetween.

The sensor driving circuit 200C may apply a first driving signal to one of the two selected channels and apply a second driving signal to the other ones of the two selected channels. The sensor driving circuit 200C may drive the five channels by scanning. The second driving signal may be a reverse phase signal of the first driving signal. For example, the first driving signal may be a sinusoidal signal. In one or more embodiments, when the first driving signal is a square wave signal, the second driving signal may have a constant voltage (e.g., a predetermined constant voltage).

A current path is formed by respectively applying the first driving signal and the second driving signal to the selected two channels. Two channels that form a current path in such a manner may be defined as a charging channel. Such a current path may have a coil form, and an RLC resonant circuit of the pen PN (see FIG. 5) may be charged by an induced magnetic field that is formed by the current path.

The first electrodes 210, the second electrodes 220, the third electrodes 230, and the fourth electrodes 240 may operate during a pen sensing driving mode of the second mode. The RLC resonant circuit of the pen PN (see FIG. 5) charged during the charge driving mode of the second mode may emit a magnetic field of a resonant frequency while discharging charged charges.

Induced current may occur in the first electrodes 210 due to a magnetic field provided from the pen PN. Induced current may occur in the third electrodes 230 overlapping the first electrodes 210. A coupling capacitor is formed between each of the first electrodes 210 and a corresponding third electrode 230, and induced current that is formed in the third electrode 230 may be transmitted to a corresponding first electrode 210 through the coupling capacitor. At the same time, induced current may occur in the second electrodes 220, and induced current may occur in the fourth electrodes 240 overlapping the second electrodes 220. A coupling capacitor is formed between each of the second electrodes 220 and a corresponding fourth electrode 240, and induced current that is formed in the fourth electrode 240 may be transmitted to a corresponding second electrode 220 through the coupling capacitor. The sensor driving circuit 200C (see FIG. 5) may measure values of induced current from the second electrodes 220 and calculate coordinate information about the second input 3000 (see FIG. 5) in the first direction DR1 and in the second direction DR2.

FIGS. 8A and 9A schematically illustrate a boundary of each of components in a line without illustrating a shape of a mesh structure. That is, it may be understood that lines illustrated in FIGS. 8A and 9A correspond to cutting lines along which mesh structures illustrated in FIGS. 8B and 9B are cut, and FIGS. 8B and 9B illustrate the cutting lines in a dashed line. A shape of a sensing unit SU illustrated in FIGS. 7, 8A, 8B, 9A, and 9B is merely an example, and the present disclosure is not limited thereto. A shape of the sensing unit SU may be variously changed.

Referring to FIG. 8A, the first conductive layer SU202 includes a third electrode 230, a plurality of second patterns 241, and a plurality of first bridge patterns 212. The third electrode 230, the plurality of second patterns 241, and the plurality of first bridge patterns 212 are disposed to be spaced (e.g., spaced apart) from each other in a plan view.

The third electrode 230 may include a plurality of division electrodes 230-*dp* arranged along the first direction DR1 and spaced (e.g., spaced apart) from each other. The division electrodes 230-*dp* may each extend along the second direction DR2.

The division electrodes 230-*dp* may each have an integrated shape. Because the division electrode 230-*dp* does not include portions disposed on different layers, resistance of a contact connecting the portions disposed on different layers may not occur. When the division electrode 230-*dp* operates as a charging electrode in a charge driving mode, a magnetic field and current for charging a resonant circuit of the pen PN (see FIG. 5) may be easily generated due to low resistance.

Openings 230*op* may be defined in each of the division electrodes 230-*dp*. The openings 230*op* are arranged along the second direction DR2 at constant intervals. The openings 230*op* of the division electrodes 230-*dp* arranged along the first direction DR1 may be aligned in the first direction DR1.

In the present embodiment, it is illustrated as an example that three division electrodes 230-*dp* are included in one sensing unit SU, but the present disclosure is not particularly limited thereto. The division electrodes 230-*dp* may each correspond to a resistance path or a signal transmission path through which a signal is transmitted.

As illustrated in FIG. 7, one fifth trace line 230*rt*2 is electrically connected to one first electrode group 230*pc*. One first electrode group 230*pc* may include two third electrodes 230. In this case, one fifth trace line 230*rt*2 may be electrically connected to six division electrodes 230-*dp*.

The plurality of second patterns 241 are disposed between the division electrodes 230-*dp* in the first direction DR1. The second patterns 241 disposed between adjacent two division electrodes 230-*dp* are arranged along the second direction DR2. The opening 230*op* is disposed between the second patterns 241 adjacent in the first direction DR1. An opening 240*op* may be defined in each of the plurality of second patterns 241.

The first bridge patterns 212 may be disposed between the second patterns 241 in the first direction DR1. The first bridge patterns 212 are arranged along the second direction DR2 along the division electrode 230-*dp*. In the present embodiment, it is illustrated as an example that two first bridge patterns 212 are disposed for each opening 230*op* of the division electrodes 230-*dp*.

Referring to FIG. 8B, the first conductive layer SU202 includes first line components MS1, which define the division electrodes 230-*dp*, the second patterns 241, and the first bridge patterns 212 of FIG. 8A. In other words, the third electrode 230, the plurality of second patterns 241, and the plurality of first bridge patterns 212 may each include the first line components MS1.

The first line components MS1 may include first direction components MS1-1 extending along a first cross direction CDR1 and second direction components MS1-2 extending along a second cross direction CDR2 crossing the first cross direction CDR1. The first direction components MS1-1 and the second direction components MS1-2 may cross each other and define mesh openings MSH. The light-emitting region LA of FIG. 6 is disposed in each of the mesh openings MSH. In addition, the first line components MS1 are disposed so as to overlap the non-light-emitting region NLA of FIG. 6.

Referring to FIG. 8B, the first conductive layer SU202 may further include dummy patterns DMP. The dummy patterns DMP are spaced (e.g., spaced apart) from the division electrodes 230-*dp*, the plurality of second patterns 241, and the plurality of first bridge patterns 212 and disposed in a region in which the division electrodes 230-*dp*, the plurality of second patterns 241, and the plurality of first bridge patterns 212 are not disposed. The dummy patterns DMP may be disposed in the openings 230*op* and the openings 240*op*.

Referring to FIG. 8B, the division electrode 230-*dp* may include a first portion P1 having a first width WT1 in the first direction DR1 and a second portion P2 having a second width WT2 in the first direction DR1. The first width WT1 may be greater than the second width WT2. For example, the first portion P1 having the first width WT1 may be further adjacent to the first bridge patterns 212 than the second portion P2 having the second width WT2. In a plan view, the first portion P1 having the first width WT1 may overlap first patterns 211 of FIG. 9B to form a capacitor. In addition, the second portion P2 having the second width WT2 may overlap a dummy pattern DMP surrounded by the first patterns 211 of FIG. 9B. An overlapping area of the division electrode 230-*dp* and the first patterns 211, that is, an overlapping area of the third electrode 230 and the first electrode 210 of FIG. 7 may be easily adjusted by adjusting the second width WT2.

Referring to FIG. 9A, the second conductive layer SU204 includes a second electrode 220, a plurality of first patterns 211, and a plurality of second bridge patterns 242. The second electrode 220, the plurality of first patterns 211, and the plurality of second bridge patterns 242 are disposed to be spaced (e.g., spaced apart) from each other in a plan view.

The second electrode 220 may include a plurality of division electrodes 220-*dp* arranged along the second direction DR2 and spaced (e.g., spaced apart) from each other. The division electrodes 220-*dp* may each extend along the first direction DR1. In the present embodiment, it is illustrated as an example that three division electrodes 220-*dp* are included in one sensing unit SU, but the present disclosure is not particularly limited thereto. The second electrode 220 may further include a plurality of connection portions 220*b* disposed between adjacent division electrodes 220-*dp* and having an integrated shape with the division electrodes 220-*dp*. Adjacent two division electrodes 220-*dp* and adjacent two connection portions 220*b* define an opening 220*op*.

The plurality of first patterns 211 are disposed at a position overlapping the division electrodes 230-*dp* of FIG. 9A. The plurality of first patterns 211 are each disposed in a corresponding opening 220*op* from among openings 220*op* of the second electrode 220 and aligned in the second direction DR2. The division electrode 220-*dp* is disposed between adjacent two first patterns 211.

The openings 220*op* may include a first opening 220*op*-1 in which the first pattern 211 is disposed (or which overlaps the first pattern 211) and a second opening 220*op*-2 in which the first pattern 211 is not disposed (or which does not overlap the first pattern 211). The second opening 220*op*-2 may overlap a corresponding second pattern 241 from among the second patterns 241 illustrated in FIG. 8A in a plan view. First openings 220*op*-1 and second openings 220*op*-2 are alternately disposed along the first direction DR1. The first openings 220*op*-1 are aligned in the second direction DR2, and the second openings 220*op*-2 are aligned in the second direction DR2.

The first patterns 211 aligned in the second direction DR2 are electrically connected to each other through the first bridge patterns 212 described with reference to FIG. 8A. The first patterns 211 and the first bridge patterns 212 may be electrically connected to each other through the contact hole CNT-4 penetrating the second insulating layer 203 (see FIG. 6).

The first bridge patterns 212 and the first patterns 211 aligned in the second direction DR2 define a division electrode of the fourth electrode 240 described with reference to FIG. 7. As a result, the first bridge patterns 212 and the first patterns 211 illustrated in FIGS. 8A and 9A define three division electrodes of the fourth electrode 240. The three division electrodes of the fourth electrode 240 may be electrically connected to each other.

The second bridge patterns 242 are disposed in the openings 220*op* of the second electrode 220 so as to be adjacent to the plurality of first patterns 211. The second bridge patterns 242 aligned in the first direction DR1 electrically connect second patterns 241 aligned in the first direction DR1 from among the second patterns 241 described with reference to FIG. 8A. The second patterns 241 and the second bridge patterns 242 may be electrically connected to each other through the contact hole CNT-4 penetrating the second insulating layer 203 (see FIG. 6).

The second bridge patterns 242 and the second patterns 241 aligned in the first direction DR1 define a division electrode of the first electrode 210 describe with reference to FIG. 7. As a result, the second patterns 241 and the second bridge patterns 242 illustrated in FIGS. 8A and 9A define three division electrodes of the first electrode 210. The three division electrodes of the first electrode 210 may be electrically connected to each other.

Referring to FIG. 9B, the second conductive layer SU204 includes second line components MS2, which define the division electrodes 220-*dp*, the connection portions 220*b*, the first patterns 211, and the second bridge patterns 242 of FIG. 9A. In other words, the second electrode 220, the plurality of first patterns 211, and the plurality of second bridge patterns 242 may each include the second line components MS2.

The second line components MS2 may include first direction components MS2-1 extending along the first cross direction CDR1 and second direction components MS2-2 extending along the second cross direction CDR2. The first direction components MS2-1 of the second line components MS2 may extend in the same direction as the first direction components MS1-1 of the first line components MS1 described with reference to FIG. 8B, and the second direction components MS2-2 of the second line components MS2 may extend in the same direction as the second direction components MS1-2 of the first line components MS1 described with reference to FIG. 8B.

Referring to FIG. 9B, the second conductive layer SU204 may further include dummy patterns DMP. The dummy patterns DMP are spaced (e.g., spaced apart) from the division electrodes 220-*dp*, the plurality of first patterns 211, and the plurality of second bridge patterns 242 and disposed in a region in which the division electrodes 220-*dp*, the plurality of first patterns 211, and the plurality of second bridge patterns 242 are not disposed. The dummy patterns DMP may be disposed between the division electrodes 220-*dp* and the first patterns 211. The dummy patterns DMP may be disposed in an opening 210*op* of the first patterns 211.

Referring to FIG. 9B, a third width WT3 in the second direction DR2 of a portion disposed between the connection portions 220*b* of the division electrode 220-*dp* may be greater than a fourth width WT4 in the first direction DR1 of the connection portions 220*b*. An overlapping area between the second electrode 220 and the fourth electrode 240 of FIG. 8A may be adjusted by adjusting the third width WT3. A fifth width WT5 in the second direction DR2 of a portion disposed between the first patterns 211 of the division electrode 220-*dp* may be smaller than the third width WT3.

Referring to FIGS. 7-9B, the third electrode 230 corresponds to an electrode that transmits a signal when performing touch sensing and pen sensing, and the fourth electrode 240 corresponds to an electrode that forms a capacitor with the third electrode 230 when performing pen sensing. Resistance of an electrode further involving an operation of the input sensor 200 may be reduced by implementing the third electrode 230 as the same one layer and implementing the fourth electrode 240 as two different layers.

In one or more embodiments, a first capacitor may be defined between the first electrode 210 and the third electrode 230, and a second capacitor may be defined between the second electrode 220 and the fourth electrode 240. A capacitance of the first capacitor and a capacitance of the second capacitor may be adjusted by an overlapping area between the first electrode 210 and the third electrode 230 and an overlapping area between the second electrode 220 and the fourth electrode 240.

As the capacitances increase, the amount of induced current transmitted from the third electrode 230 to the first electrode 210 and the amount of induced current transmitted from the fourth electrode 240 to the second electrode 220 may increase. Thus, as the capacitances increase, pen sensing performance of the input sensor 200 may be improved. In addition, the capacitances may act as a load when performing touch sensing. Thus, as the capacitances decrease, touch sensing performance may be improved.

According to one or more embodiments, an overlapping area of the first electrode 210 and the third electrode 230 and an overlapping area of the second electrode 220 and the fourth electrode 240 may be easily adjusted. Thus, the input sensor 200 having capacitances at an appropriate level in consideration of touch sensitivity and pen sensing sensitivity may be provided. As a result, the electronic device ED (see FIG. 1) having both of improved pen sensitivity and touch sensitivity may be provided.

Figure 10A:
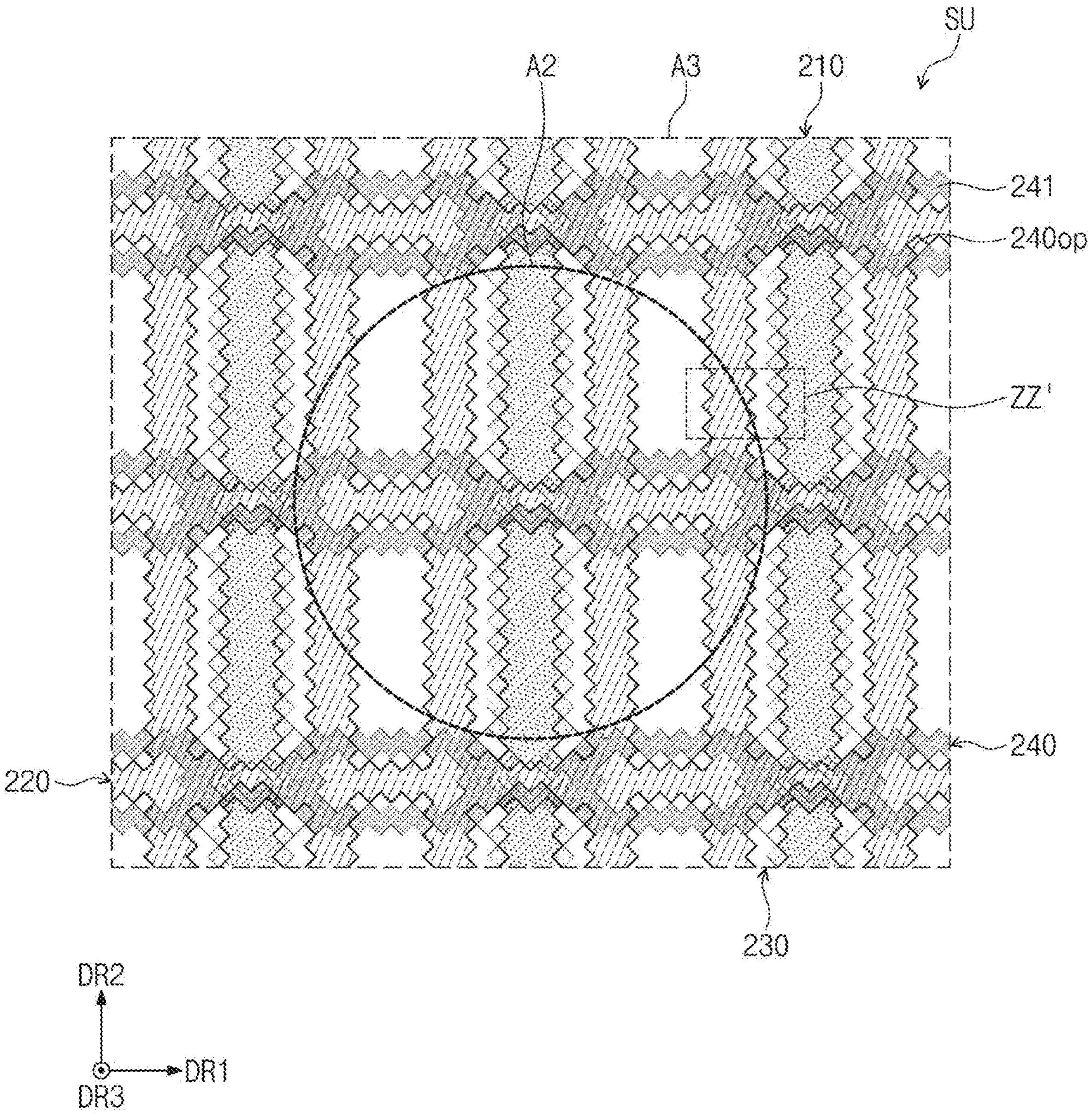
FIG. 10A is a plan view illustrating a partial region according to one or more embodiments.
Figure 10B:
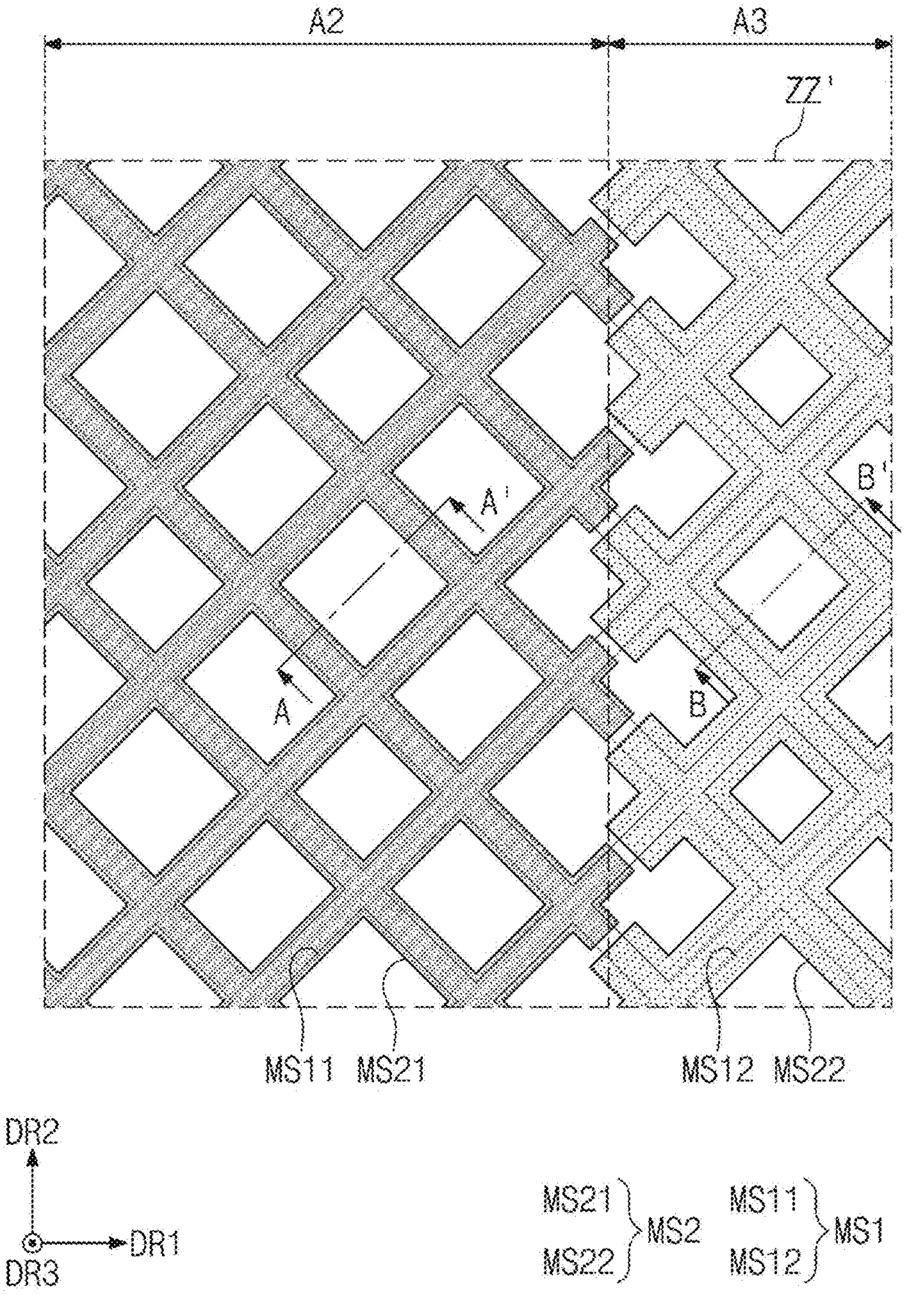
FIG. 10B is an enlarged plan view of a third region illustrated in FIG. 10A.
Figure 10C:
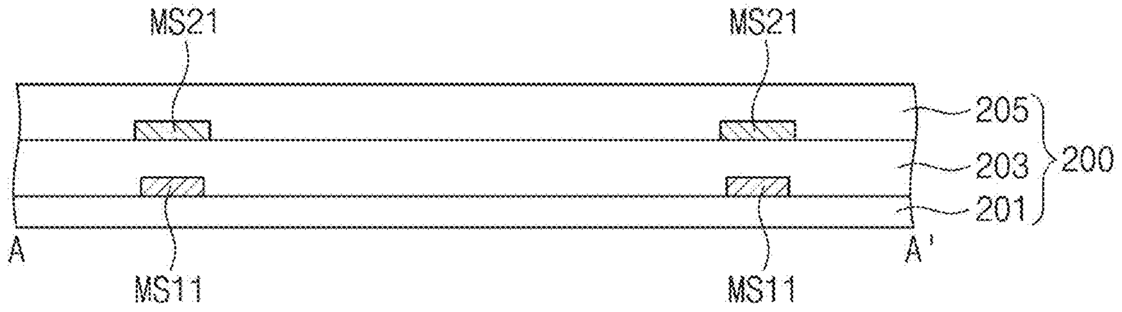
FIG. 10C is a cross-sectional view taken along the line A-A' of FIG. 10B.
Figure 10D:
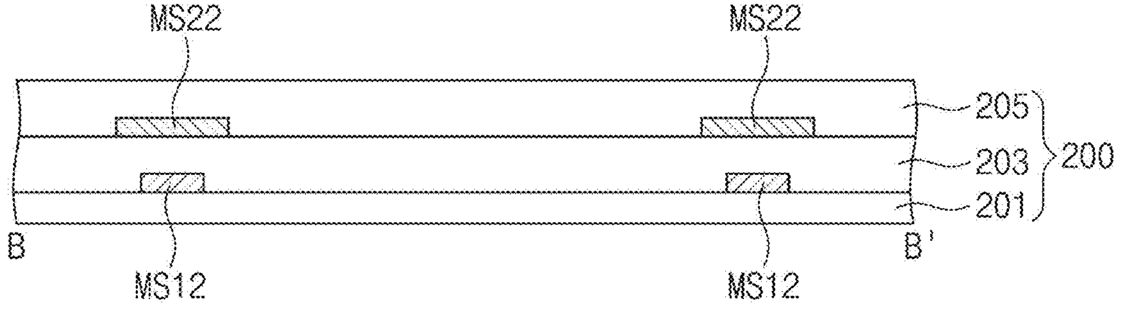
FIG. 10D is a cross-sectional view taken along the line B-B' of FIG. 10B.

FIG. 10A is a plan view illustrating a partial region according to one or more embodiments. FIG. 10B is an enlarged plan view of a third region ZZ' illustrated in FIG. 10A. FIG. 10C is a cross-sectional view taken along the line A-A' of FIG. 10B. FIG. 10D is a cross-sectional view taken along the line B-B' of FIG. 10B.

FIG. 10A partially illustrates the second region A2 and the third region A3 around the second region A2 of FIG. 7. FIG. 10A illustrates, as an example, one sensing unit SU in which the first conductive layer SU202 of FIG. 8A and the second conductive layer SU204 of FIG. 9A are disposed to overlap.

As illustrated in FIG. 10A, the second region A2 may be disposed in any region in one sensing unit SU. In addition, in one or more embodiments, the second region A2 may be disposed to overlap a boundary between a plurality of sensing units SU.

FIG. 10B illustrates a boundary between the second region A2 and the third region A3. The first line components MS1 described with reference to FIG. 8B and the second line components MS2 are disposed to overlap. Because the second line components MS2 are disposed to overlap the first line components MS1, the first line components MS1 may be less likely to be viewed by a user when the user views the electronic device ED from the outside of the electronic device ED (see FIG. 1). Thus, external light reflectance and a reflection pattern may be determined by the second line components MS2.

FIG. 10B illustrates that the second line components MS2 mostly cover the first line components MS1, but the present disclosure is not limited thereto. An intermittence region (or a cut region) may be disposed in the second line components MS2, and the first line component MS1 may be exposed from the second line component MS2 in such a region.

The first line components MS1 include (1-1)-th line components MS11 disposed in the second region A2 and (1-2)-th line components MS12 disposed in the third region A3. The second line components MS2 include (2-1)-th line components MS21 disposed in the second region A2 and (2-2)-th line components MS22 disposed in the third region A3.

The (1-1)-th line components MS11 each have a line width same as or smaller than that of a (2-1)-th line component MS21 disposed thereon. The (1-2)-th line components MS12 each have a line width same as or smaller than that of a (2-2)-th line component MS22 disposed thereon.

As illustrated in FIGS. 10C and 10D, the (2-1)-th line components MS21 may have a smaller line width than the (2-2)-th line component MS22. Because the (2-1)-th line components MS21 disposed in the second region A2 have a relatively small line width, a transmittance of incident light passing through the second region A2 may be increased. This is because an opening ratio of the second region A2 increases as an area occupied by the line components MS21 is decreased. Accordingly, the photo sensor PS of FIG. 2 that receives light passing through the second region A2 may have relatively high light reception rate.

The (1-1)-th line components MS11 and the (1-2)-th line components MS12 may have substantially the same line width. The (1-1)-th line components MS11 and the (1-2)-th line components MS12 do not have much impact on a transmittance of incident light. Because the (1-1)-th line components MS11 and the (1-2)-th line components MS12 have the same line width, the division electrodes 230-*dp*, the second patterns 241, and the first bridge patterns 212 described with reference to FIG. 8A may be uniformly designed regardless of regions. Accordingly, sensitivity variations due to regions may be reduced in an operation of an input sensor in a touch sensing mode and a pen sensing mode.

Figure 11:
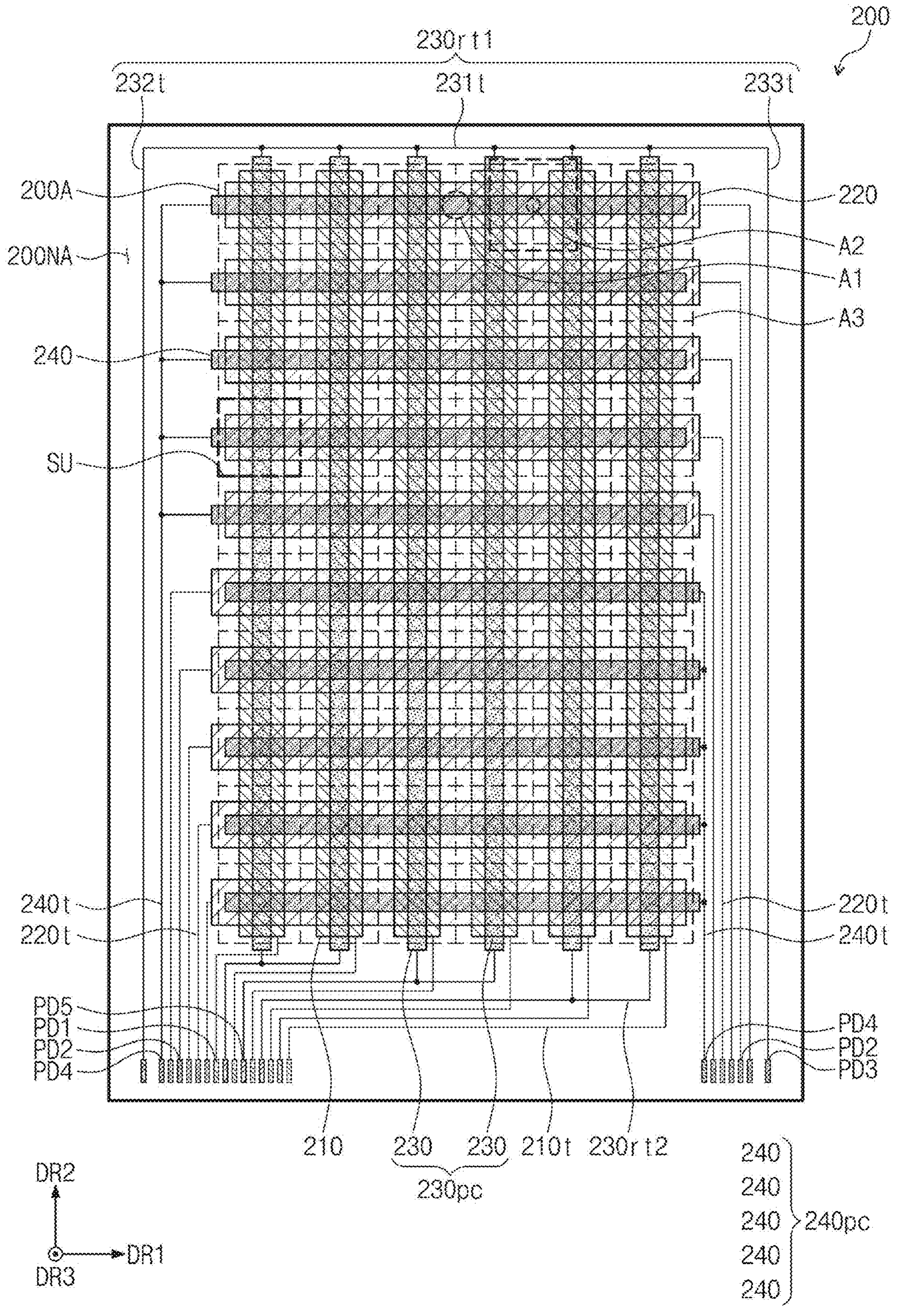
FIG. 11 is a plan view of an input sensor according to one or more embodiments.

FIG. 11 is a plan view of an input sensor 200 according to one or more embodiments. Hereinafter, detailed description of a component same as that described with reference to FIGS. 7 and 10A-10D will not be provided.

Unlike FIG. 7 in which the first electrodes 210, the second electrodes 220, the third electrodes 230, and the fourth electrodes 240 are not disposed in the first region A1, first electrodes 210, second electrodes 220, third electrodes 230, and fourth electrodes 240 may be disposed in a first region A1 illustrated in FIG. 11.

The first region A1 is disposed to be continuous with a third region A3 as the second region A2 illustrated in FIG. 10A. However, because the first region A1 has a larger area than a second region A2, more sensing units SU may be disposed to overlap in the first region A1 than the second region A2. In the first region A1, one or more sensing units SU may entirely overlap and a plurality of sensing units may partially overlap.

The (1-1)-th line components MS11 and the (2-1)-th line component MS21 described with reference to FIGS. 10B-10D may be disposed in the first region A1. Second line components disposed in the first region A1 may have a smaller line width than the second line components MS2 disposed in the second region A2. First line components disposed in the first region A1 may have the same line with as the first line components MS1 disposed in the second region A2. Accordingly, the first region A1 may have a transmittance of incident light that is similar to or greater than that of the second region A2.

According to the above descriptions, not only an input from a user's body but also an input from a pen may be sensed. An input from a user's body may be sensed using a capacitive method, and an input from a passive type pen may be sensed using an electromagnetic induction method.

Even if two conductive layers are included, because a conductive pattern of an upper conductive layer overlaps a conductive pattern of a lower conductive layer, the amount of light incident to the lower conductive layer may be reduced. Accordingly, a difference in reflection amount of light (e.g., a difference in the amount of reflected light) according to regions generated by light reflection from a lower conductive pattern may be reduced. As a result, deterioration in display quality may be suppressed.

A line width of an upper conductive pattern may be changed in a region overlapping a photo sensor of an input sensor. Even if the photo sensor is disposed below a display device, efficiency of light incident to the photo sensor may be increased.

Although description has been made with reference to the present disclosure, it is understood that the present disclosure should not be limited to these embodiments, but various changes and modifications may be made by one ordinary skilled in the art within the spirit and scope of the present disclosure as hereinafter claimed.

Therefore, the technical scope of the present disclosure is not limited to the contents described in the detailed description of the specification, but should be determined by the accompanying claims and their equivalents.

What is claimed is:

1. A display device comprising:
a display panel; and
an input sensor on the display panel and including:
 a sensing region including a first region and a second region having a larger area than the first region; and
 a peripheral region located at an outer side of the sensing region;
wherein the input sensor comprises:
 a first conductive layer comprising a plurality of first line components;
 an insulating layer on the first conductive layer; and
 a second conductive layer on the insulating layer and comprising a plurality of second line components,
 wherein the first line components comprise (1-1)-th line components in the first region and (1-2)-th line components in the second region,
 wherein the second line components comprise (2-1)-th line components in the first region and (2-2)-th line components in the second region,
 wherein at least some of the (1-1)-th line components overlap a corresponding (2-1)-th line component from among the (2-1)-th line components, and the at least some of the (1-1)-th line components have a same line width as or a smaller line width than the corresponding (2-1)-th line component,
 wherein at least some of the (1-2)-th line components overlap a corresponding (2-2)-th line component from among the (2-2)-th line components, and the at least some of the (1-2)-th line components have a same line width as or a smaller line width than the corresponding (2-2)-th line component, and
 wherein the corresponding (2-1)-th line component has a smaller line width than the corresponding (2-2)-th line component.

2. The display device of claim 1, wherein the (1-1)-th line components and the (1-2)-th line components have substantially the same line width.

3. The display device of claim 1, wherein the plurality of first line components defines:
a first electrode comprising division electrodes arranged along a first direction and extending in a second direction crossing the first direction;
first patterns between the division electrodes in the first direction and arranged along the second direction; and
first bridge patterns between the first patterns in the first direction and arranged along the second direction, and
wherein the first electrode, the first patterns, and the first bridge patterns are spaced in a plan view.

4. The display device of claim 3, wherein the plurality of second line components defines:
a second electrode extending in the first direction and having a plurality of openings defined therein;
second patterns in a corresponding opening from among the plurality of openings and electrically connected in the second direction by the first bridge patterns; and
second bridge patterns electrically connecting the first patterns in the first direction, and
wherein the second electrode, the second patterns, and the second bridge patterns are spaced in a plan view.

5. The display device of claim 4, wherein the plurality of openings comprises first openings and second openings,
wherein the first openings and the second openings are alternately arranged along the first direction, and
wherein the first openings overlap the second patterns, and the second openings do not overlap the second patterns.

6. The display device of claim 5, wherein the second openings overlap the first patterns.

7. The display device of claim 4, wherein the input sensor further comprises a trace line in the peripheral region and connected to a corresponding component one selected from among the first electrode, the second electrode, the first patterns, and the second patterns.

8. The display device of claim 3, wherein the first electrode is configured to induced a magnetic field in response to a current flowing therethrough.

9. The display device of claim 1, wherein the display panel comprises a plurality of light-emitting regions and a non-light-emitting region between the plurality of light-emitting regions, and
wherein the plurality of first line components and the plurality of second line components are in the non-light-emitting region and define mesh opening regions corresponding to the plurality of light-emitting regions.

10. An electronic device comprising:
a display device comprising a display panel and an input sensor including a sensing region including a first region and a second region having a larger area than the first region; and
a photo sensor located below the display device and overlapping the second region,
wherein the input sensor comprises:
a first conductive layer comprising a plurality of first line components;
an insulating layer on the first conductive layer; and
a second conductive layer on the insulating layer and comprising a plurality of second line components,
wherein the first line components comprise (1-1)-th line components in the first region and (1-2)-th line components in the second region, and the second line components comprise (2-1)-th line components in the first region and (2-2)-th line components in the second region,
wherein at least some of the (1-1)-th line components overlap a corresponding (2-1)-th line component from among the (2-1)-th line components, and the at least some of the (1-1)-th line components have a same line width as or a smaller line width than the corresponding (2-1)-th line component,
wherein at least some of the (1-2)-th line components overlap a corresponding (2-2)-th line component from among the (2-2)-th line components, and the at least some of the (1-2)-th line components have a same line width as or a smaller line width than the corresponding (2-2)-th line component, and
wherein the corresponding (2-1)-th line component has a smaller line width than the corresponding (2-2)-th line component.

11. The electronic device of claim 10, further comprising an input device configured to generate a magnetic field of a resonant frequency.

12. The electronic device of claim 11, wherein the input device comprises a pen comprising an RLC resonant circuit.

13. The electronic device of claim 11, wherein the input device is charged by a magnetic field induced by current flowing through the second conductive layer.

14. The electronic device of claim 10, wherein the (1-1)-th line components and the (1-2)-th line components have substantially a same line width.

15. The electronic device of claim 10, wherein the plurality of first line components define:
a first electrode including division electrodes arranged along a first direction and extending in a second direction crossing the first direction;
first patterns between the division electrodes in the first direction and arranged along the second direction; and
first bridge patterns between the first patterns in the first direction and arranged along the second direction, and
wherein the first electrode, the first patterns, and the first bridge patterns are spaced from each other in a plan view.

16. The electronic device of claim 15, wherein the plurality of second line components defines:
a second electrode extending in the first direction and having a plurality of openings defined therein;
second patterns in a corresponding opening from among the plurality of openings and electrically connected in the second direction by the first bridge patterns; and
second bridge patterns electrically connecting the first patterns in the first direction, and
wherein the second electrode, the second patterns, and the second bridge patterns are spaced from each other in a plan view.

17. The electronic device of claim 16, wherein the plurality of openings comprises first openings and second openings,
wherein the first openings and the second openings are alternately arranged along the first direction, and
wherein the first openings overlap the second patterns, and the second openings do not overlap the second patterns.

18. The electronic device of claim 17, wherein the second openings overlap the first patterns.

19. The electronic device of claim 10, wherein the display panel comprises a plurality of light-emitting regions, wherein some of the plurality of light-emitting regions overlap the first region, and other ones of the plurality of light-emitting regions overlap the second region, and wherein arrangement of light-emitting regions overlapping the first region and arrangement of light-emitting regions overlapping the second region are same as each other.

20. An electronic device comprising:

a display device comprising a display panel and an input sensor including a sensing region including a first region and a second region having a larger area than the first region; and a photo sensor located below the display device and overlapping the first region, wherein the input sensor comprises:

a first electrode comprising division electrodes arranged along a first direction and extending in a second direction crossing the first direction;

first patterns between the division electrodes in the first direction and arranged along the second direction;

first bridge patterns between the first patterns in the first direction and arranged along the second direction;

an insulating layer on the first electrode, the first patterns, and the first bridge patterns;

a second electrode on the insulating layer, extending in the first direction, and having a plurality of openings defined therein;

second patterns on the insulating layer and in a corresponding opening from among the plurality of openings, and electrically connected in the second direction by the first bridge patterns; and second bridge patterns on the insulating layer and electrically connecting the first patterns in the first direction, wherein the first electrode, the first patterns, and the first bridge patterns comprise first line components, and the second electrode, the second patterns, and the second bridge patterns comprise second line components, wherein the first line components comprise (1-1)-th line components in the first region and (1-2)-th line components in the second region, and the second line components comprise (2-1)-th line components in the first region and (2-2)-th line components in the second region, wherein at least some of the (1-1)-th line components overlap a corresponding (2-1)-th line component from among the (2-1)-th line components, and the at least some of the (1-1)-th line components have a same line width as or a smaller line width than the corresponding (2-1)-th line component, wherein at least some of the (1-2)-th line components overlap a corresponding (2-2)-th line component from among the (2-2)-th line components, and the at least some of the (1-2)-th line components have a same line width as or a smaller line width than the corresponding (2-2)-th line component, and wherein the corresponding (2-1)-th line component has a smaller line width than the corresponding (2-2)-th line component.

* * * * *